(12) United States Patent
Okuyama

(10) Patent No.: US 7,550,775 B2
(45) Date of Patent: Jun. 23, 2009

(54) GAN SEMICONDUCTOR LIGHT-EMITTING ELEMENT AND METHOD FOR MANUFACTURING THE SAME

(75) Inventor: Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/622,719

(22) Filed: Jan. 12, 2007

(65) Prior Publication Data

US 2007/0164292 A1 Jul. 19, 2007

(30) Foreign Application Priority Data

Jan. 16, 2006 (JP) .............................. 2006-007239

(51) Int. Cl.
*H01L 33/00* (2006.01)
(52) U.S. Cl. .............................. 257/94; 257/95; 257/96; 257/97; 257/E33.007
(58) Field of Classification Search .................... 257/94, 257/96, 97, 95, E33.007
See application file for complete search history.

(56) References Cited

U.S. PATENT DOCUMENTS

| | | | |
|---|---|---|---|
| 6,320,209 B1 | 11/2001 | Hata et al. | |
| 6,870,190 B2 | 3/2005 | Okuyama et al. | |
| 2002/0171089 A1 | 11/2002 | Okuyama et al. | |
| 2003/0168666 A1 | 9/2003 | Okuyama et al. | |
| 2005/0179025 A1* | 8/2005 | Okuyama et al. | ............. 257/13 |
| 2005/0245095 A1* | 11/2005 | Haskell et al. | ............. 438/767 |

FOREIGN PATENT DOCUMENTS

| | | | |
|---|---|---|---|
| JP | 11-312840 | | 11/1999 |
| JP | 2001257166 | * | 9/2001 |
| JP | 2002-335016 | | 11/2002 |
| JP | 2003-218395 | | 7/2003 |

\* cited by examiner

*Primary Examiner*—Sue Purvis
*Assistant Examiner*—Minchul Yang
(74) *Attorney, Agent, or Firm*—K&L Gates LLP

(57) ABSTRACT

A GaN semiconductor light-emitting element is provided. The GaN semiconductor light-emitting element includes an island-type seed region composed of a GaN-based compound semiconductor disposed on a substrate; an underlying layer having a three-dimensional shape composed of a GaN-based compound semiconductor, disposed on at least the seed region; a first GaN-based compound semiconductor layer of a first conductivity type, an active layer composed of a GaN-based compound semiconductor, and a second GaN-based compound semiconductor layer of a second conductivity type disposed in that order on the underlying layer; a first electrode electrically connected to the first GaN-based compound semiconductor layer; and a second electrode disposed on the second GaN-based compound semiconductor layer. The top face of the seed region is the A plane, and at least one side face of the underlying layer is the S plane.

10 Claims, 15 Drawing Sheets

[EXAMPLE 1]

[STEP-120]

[STEP-130]

[STEP-140]

[STEP-150]

[EXAMPLE 2]

[EXAMPLE 3]

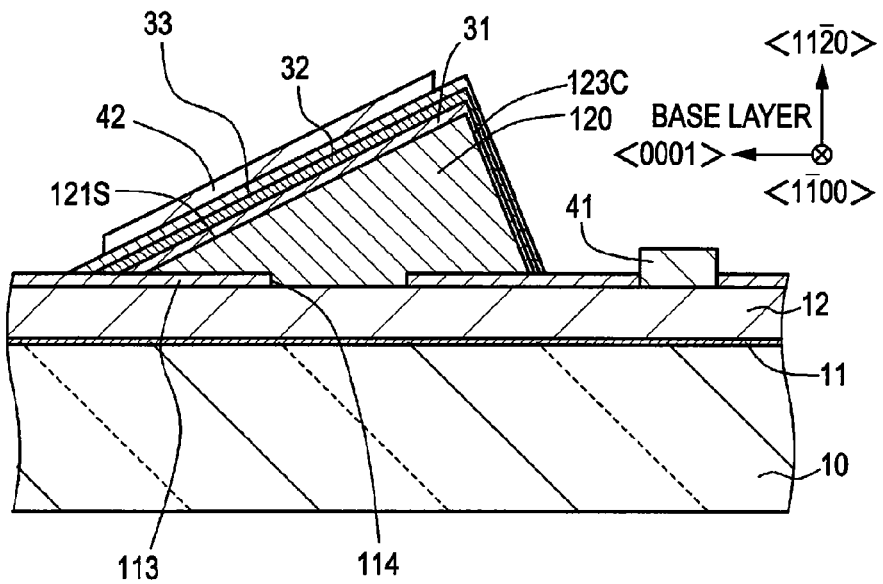
FIG. 6A [EXAMPLE 4]
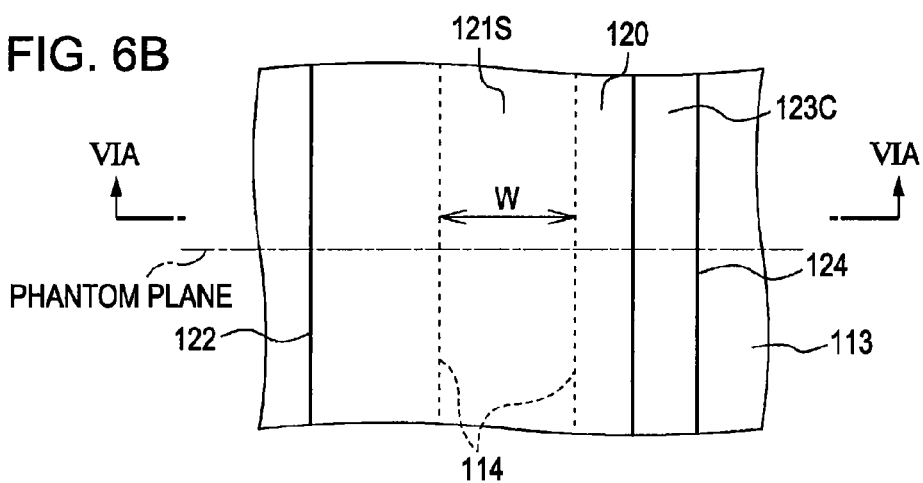
FIG. 6B
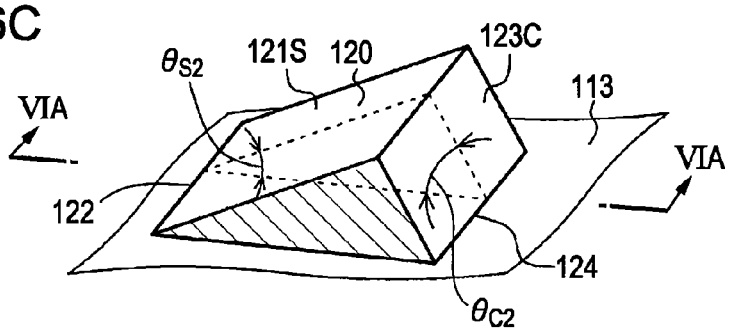
FIG. 6C

[STEP-420]

[STEP-430]

[STEP-440]

[STEP-450]

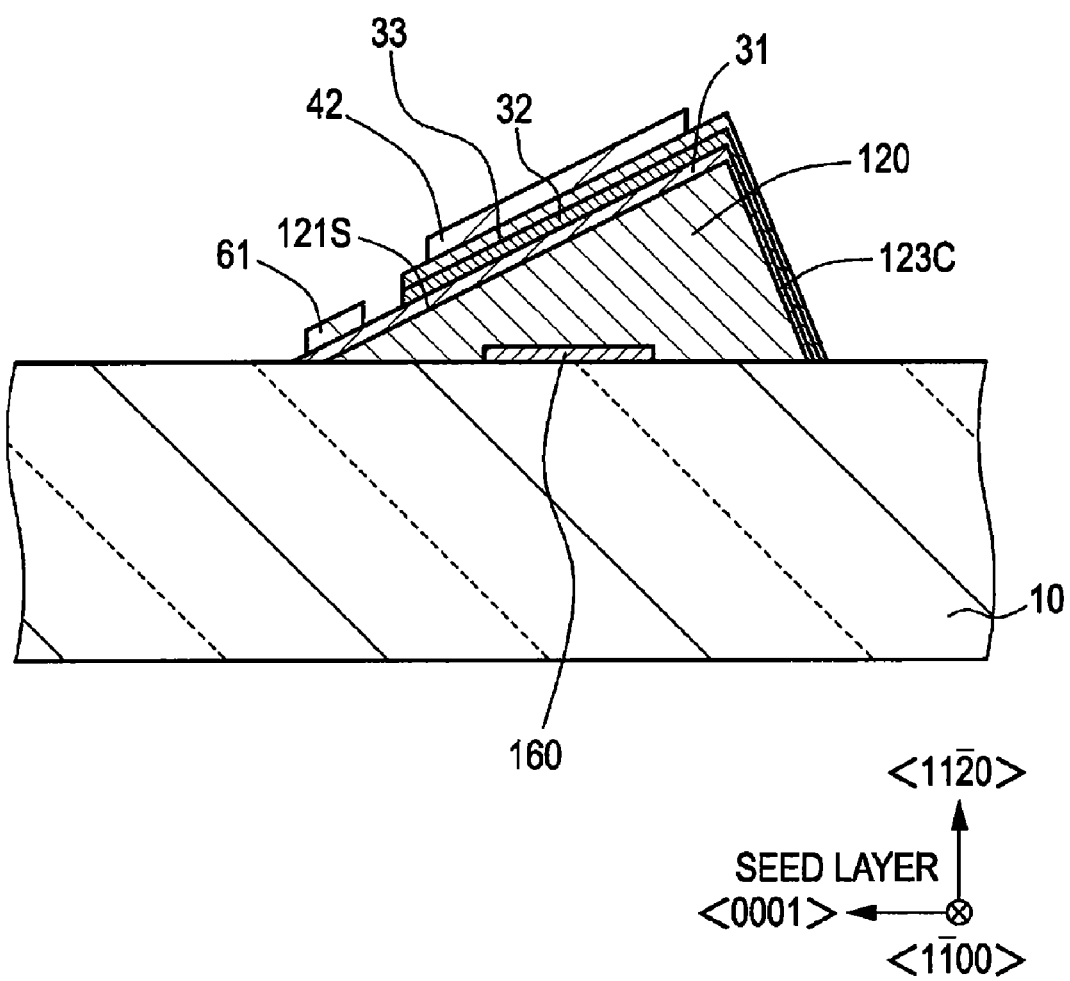

[EXAMPLE 6]

[STEP-620]

BASE LAYER  $\langle 11\bar{2}0 \rangle$ / $\langle 1\bar{1}00 \rangle$ / $\langle 0001 \rangle$

[STEP-630]

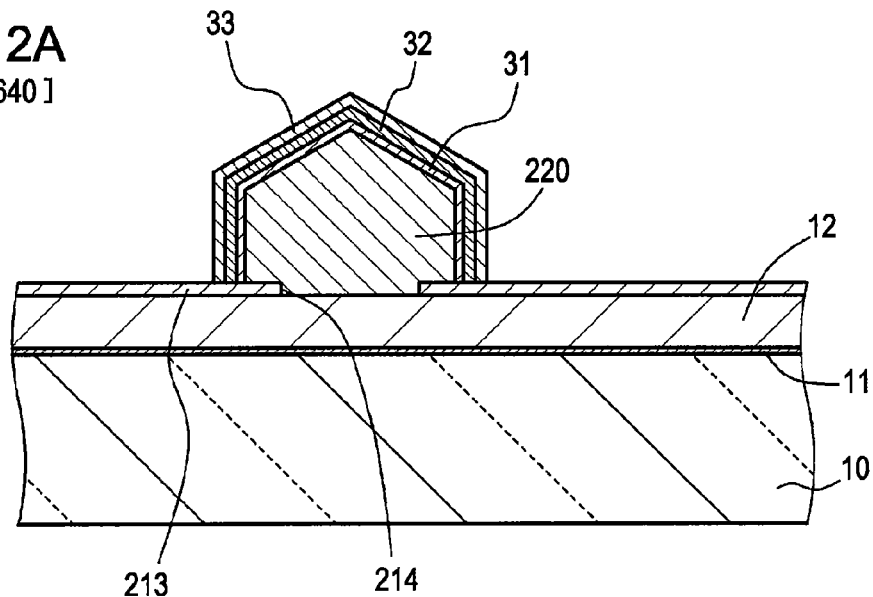
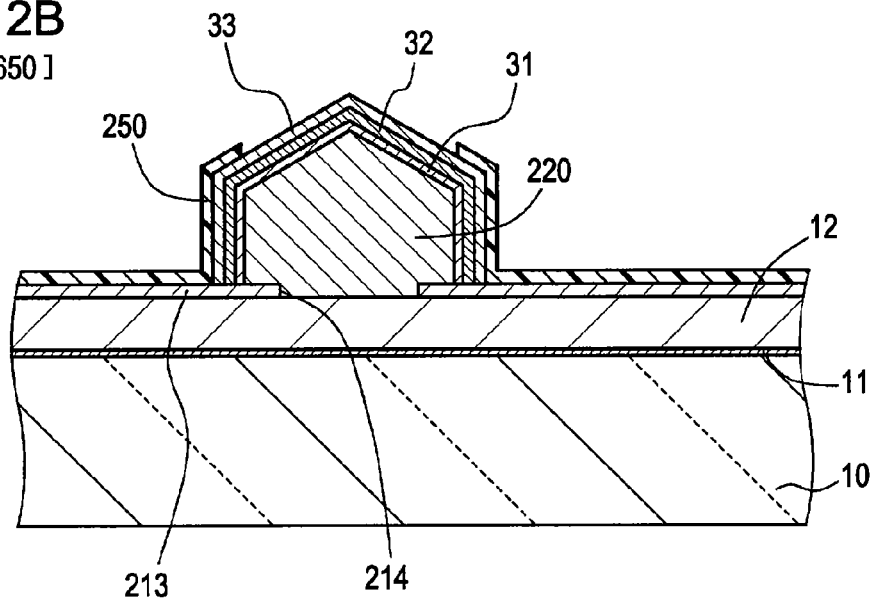

[EXAMPLE 7]

GAN SEMICONDUCTOR LIGHT-EMITTING ELEMENT AND METHOD FOR MANUFACTURING THE SAME

CROSS REFERENCES TO RELATED APPLICATIONS

The present application claims priority to Japanese Patent Application JP 2006-007239 filed in the Japanese Patent Office on Jan. 16, 2006, the entire contents of which are incorporated herein by reference.

BACKGROUND

The present invention relates to a GaN semiconductor light-emitting element and a method for manufacturing the same.

GaN semiconductor light-emitting elements having a three-dimensional shape which is pyramidal or which extends like a strip have been known, for example, from Japanese Unexamined Patent Application Publication Nos. 11-312840, 2002-335016, and 2003-218395. The GaN semiconductor light-emitting element disclosed in each of these Japanese Unexamined Patent Application Publications includes a base layer composed of a GaN-based compound semiconductor disposed on a substrate; a mask layer disposed on a top face of the base layer, the mask layer having an opening or an open region (hereinafter referred to as the opening or the like) which exposes a portion of the top face of the base layer; an underlying layer composed of a GaN-based compound semiconductor, the underlying layer being disposed on the top face of the base layer exposed in the opening or the like and extending over the mask layer in the vicinity of the opening or the like, the underlying layer having a three-dimensional shape; a first GaN-based compound semiconductor layer of a first conductivity type, an active layer composed of a GaN-based compound semiconductor, and a second GaN-based compound semiconductor layer of a second conductivity type disposed in that order on the underlying layer; a first electrode electrically connected to the first GaN-based compound semiconductor layer; and a second electrode disposed on the second GaN-based compound semiconductor layer.

In the GaN semiconductor light-emitting element disclosed in any of the Japanese Unexamined Patent Application Publications, the top face of the base layer is specifically the C plane. At least one face constituting the underlying layer is the S plane, and the inclination angle of such a face of the underlying layer with respect to the mask layer is 61.9 degrees because the top face of the base layer is the C plane.

Since the inclination angle of the face (i.e., S plane) constituting the underlying layer is large at 61.9 degrees as described above, the inclination angle of the second GaN-based compound semiconductor layer formed thereabove is also large. As a result, it is very difficult to form a second electrode on the second GaN-based compound semiconductor layer using a photolithographic step, such as a lift-off method.

SUMMARY

It is desirable to provide a GaN semiconductor light-emitting element including a structure having a three-dimensional shape which is pyramidal or which extends like a strip, in which the inclination angle of a face is gentle and an electrode can be formed easily, and a method for manufacturing the same.

A GaN semiconductor light-emitting element according to a first embodiment includes (A) an island-like seed region composed of a GaN-based compound semiconductor disposed on a substrate; (B) an underlying layer having a three-dimensional shape composed of a GaN-based compound semiconductor, disposed on at least the seed region; (C) a first GaN-based compound semiconductor layer of a first conductivity type, an active layer composed of a GaN-based compound semiconductor, and a second GaN-based compound semiconductor layer of a second conductivity type disposed in that order on the underlying layer; (D) a first electrode electrically connected to the first GaN-based compound semiconductor layer; and (E) a second electrode disposed on the second GaN-based compound semiconductor layer. The top face of the seed region is the A plane, and at least one side face of the underlying layer is the S plane.

A method for manufacturing a GaN semiconductor light-emitting element according to the first embodiment includes the steps of (a) forming an island-like seed region composed of a GaN-based compound semiconductor on a substrate; (b) forming an underlying layer on at least the seed region, the underlying layer being composed of a GaN-based compound semiconductor and having a three-dimensional shape; (c) forming a first GaN-based compound semiconductor layer of a first conductivity type, an active layer composed of a GaN-based compound semiconductor, and a second GaN-based compound semiconductor layer of a second conductivity type in that order on the underlying layer; and (d) forming a first electrode electrically connected to the first GaN-based compound semiconductor layer and forming a second electrode on the second GaN-based compound semiconductor layer. The top face of the seed region is the A plane, and at least one side face of the underlying layer is the S plane.

In the GaN semiconductor light-emitting element or the method for manufacturing the same according to the first embodiment, the GaN semiconductor light-emitting element may include a base layer composed of a GaN-based compound semiconductor disposed on the substrate and a mask layer disposed on a top face of the base layer, the mask layer having an opening which exposes a portion of the top face of the base layer. The portion of the top face of the base layer exposed in the opening corresponds to the seed region, and the underlying layer is disposed on the top face of the base layer exposed in the opening and extends over the mask layer in the vicinity of the opening. In some cases, such a structure may be referred to for convenience as the structure 1A of the present invention. In such a case, the planar shape of the opening provided in the mask layer is essentially arbitrary, and may be circular, elliptical, or polygonal, such as triangular, rectangular, pentagonal, or hexagonal. In particular, the planar shape of the opening is preferably triangular.

Alternatively, in the GaN semiconductor light-emitting element or the method for manufacturing the same according to the first embodiment, the underlying layer may be formed so as to extend from over the seed region to over the substrate. In some cases, such a structure may be referred to for convenience as the structure 1B of the present invention. In such a case, the planar shape of the seed region is essentially arbitrary, and may be circular, elliptical, or polygonal, such as triangular, rectangular, pentagonal, or hexagonal. In particular, the planar shape of the seed region is preferably triangular.

In the GaN semiconductor light-emitting element or the method for manufacturing the same according to the first embodiment, the inclination angle $\theta_{S1}$ of the side face, which is the S plane, of the underlying layer with respect to a surface of the substrate is preferably in a range of 40.2 degrees±5 degrees (1-1). In such a case, the underlying layer may have a shape of a pyramid having an isosceles triangular bottom face, in which two side faces, each being the S plane, of the underlying layer respectively have, as bases, the two sides of equal length of the bottom face, the remaining one side face has, as a base, the other side of the bottom face and is the C plane, and the inclination angle $\theta_{C1}$ of the side face, which is the C plane, of the underlying layer with respect to the surface of the substrate is in a range of 90 degrees±5 degrees (1-2). Alternatively, the underlying layer may have a shape of a truncated pyramid having an isosceles triangular bottom face, in which two side faces, each being the S plane, of the underlying layer respectively have, as bases, the two sides of equal length of the bottom face, the remaining one side face has, as a base, the other side of the bottom face and is the C plane, a top face of the underlying layer is the A plane, and the inclination angle $\theta_{C1}$ of the side face, which is the C plane, of the underlying layer with respect to the surface of the substrate is in a range of 90 degrees±5 degrees (1-2). It depends on crystal growth conditions whether the underlying layer has the shape of a pyramid or the shape of a truncated pyramid.

Herein, the inclination angle $\theta_{S1}$ is defined as an angle between the side face and the surface of the substrate on the assumption that the underlying layer is cut along a phantom plane that is at right angles to the base of the underlying layer and that is perpendicular to the surface of the substrate.

A GaN semiconductor light-emitting element according to a second embodiment includes (A) a strip-like seed region composed of a GaN-based compound semiconductor disposed on a substrate; (B) an underlying layer having a three-dimensional shape composed of a GaN-based compound semiconductor, disposed on at least the seed region; (C) a first GaN-based compound semiconductor layer of a first conductivity type, an active layer composed of a GaN-based compound semiconductor, and a second GaN-based compound semiconductor layer of a second conductivity type disposed in that order on the underlying layer; (D) a first electrode electrically connected to the first GaN-based compound semiconductor layer; and (E) a second electrode disposed on the second GaN-based compound semiconductor layer. The top face of the seed region is the A plane, the strip-like seed region extends in the <1-100> direction of the seed region, and one inclined face of the underlying layer is the S plane.

A method for manufacturing a GaN semiconductor light-emitting element according to the second embodiment includes the steps of (a) forming a strip-like seed region composed of a GaN-based compound semiconductor on a substrate; (b) forming an underlying layer on at least the seed region, the underlying layer being composed of a GaN-based compound semiconductor and having a three-dimensional shape; (c) forming a first GaN-based compound semiconductor layer of a first conductivity type, an active layer composed of a GaN-based compound semiconductor, and a second GaN-based compound semiconductor layer of a second conductivity type in that order on the underlying layer; and (d) forming a first electrode electrically connected to the first GaN-based compound semiconductor layer and forming a second electrode on the second GaN-based compound semiconductor layer. The top face of the seed region is the A plane, the strip-like seed region extends in the <1-100> direction of the seed region, and one inclined face of the underlying layer is the S plane.

In the GaN semiconductor light-emitting element or the method for manufacturing the same according to the second embodiment, the GaN semiconductor light-emitting element may include a base layer composed of a GaN-based compound semiconductor disposed on the substrate and a mask layer disposed on a top face of the base layer, the mask layer having a strip-like open region which exposes a portion of the top face of the base layer. The portion of the top face of the base layer exposed in the strip-like open region corresponds to the seed region, and the underlying layer is disposed on the top face of the base layer exposed in the open region and extends over the mask layer in the vicinity of the open region. In some cases, such a structure may be referred to for convenience as the structure 2A of the present invention.

Alternatively, in the GaN semiconductor light-emitting element or the method for manufacturing the same according to the second embodiment, the underlying layer may be formed so as to extend over the seed region and over the substrate. In some cases, such a structure may be referred to for convenience as the structure 2B of the present invention.

In the GaN semiconductor light-emitting element or the method for manufacturing the same according to the second embodiment, the shape of a cross-section of the underlying layer taken along the <0001> direction of the seed region is triangular, and the inclination angle $\theta_{S2}$ of the inclined face, which is the S plane, of the underlying layer with respect to a surface of the substrate is preferably in a range of 40.2 degrees±5 degrees (2-1). In such a case, the other inclined face of the underlying layer may be the C plane, in which the inclination angle $\theta_{C2}$ of the other inclined face, which is the C plane, of the underlying layer with respect to the surface of the substrate is in a range of 90 degrees±5 degrees (2-2).

Herein, the inclination angle $\theta_{S2}$ is defined as an angle between the inclined face and the surface of the substrate on the assumption that the underlying layer is cut along a phantom plane that is at right angles to the base of the inclined face and that is perpendicular to the surface of the substrate.

A GaN semiconductor light-emitting element according to a third embodiment includes (A) a strip-like seed region composed of a GaN-based compound semiconductor disposed on a substrate; (B) an underlying layer having a three-dimensional shape composed of a GaN-based compound semiconductor, disposed on at least the seed region; (C) a first GaN-based compound semiconductor layer of a first conductivity type, an active layer composed of a GaN-based compound semiconductor, and a second GaN-based compound semiconductor layer of a second conductivity type disposed in that order on the underlying layer; (D) a first electrode electrically connected to the first GaN-based compound semiconductor layer; and (E) a second electrode disposed on the second GaN-based compound semiconductor layer. The top face of the seed region is the A plane, the strip-like seed region extends in the <0001> direction of the seed region, and at least one face of the underlying layer is the M plane.

A method for manufacturing a GaN semiconductor light-emitting element according to the third embodiment includes the steps of (a) forming a strip-like seed region composed of a GaN-based compound semiconductor on a substrate; (b) forming an underlying layer on at least the seed region, the underlying layer being composed of a GaN-based compound semiconductor and having a three-dimensional shape; (c) forming a first GaN-based compound semiconductor layer of a first conductivity type, an active layer composed of a GaN-based compound semiconductor, and a second GaN-based compound semiconductor layer of a second conductivity type in that order on the underlying layer; and (d) forming a first electrode electrically connected to the first GaN-based compound semiconductor layer and forming a second electrode on the second GaN-based compound semiconductor layer. The top face of the seed region is the A plane, the strip-like seed region extends in the <0001> direction of the seed region, and at least one face of the underlying layer is the M plane.

In the GaN semiconductor light-emitting element or the method for manufacturing the same according to the third embodiment, the GaN semiconductor light-emitting element may include a base layer composed of a GaN-based compound semiconductor disposed on the substrate and a mask layer disposed on a top face of the base layer, the mask layer having a strip-like open region which exposes a portion of the top face of the base layer. The portion of the top face of the base layer exposed in the strip-like open region corresponds to the seed region, and the underlying layer is disposed on the top face of the base layer exposed in the open region.

In the GaN semiconductor light-emitting element or the method for manufacturing the same according to the third embodiment, the shape of a cross-section of the underlying layer taken along the <1-100> direction of the seed region has, at least, two side faces extending upward substantially perpendicular to a surface of the substrate and two top faces extending from the upper ends of the side faces and meeting each other. The two side faces and the two top faces of the underlying layer are each the M plane. The inclination angle of $\theta_M$ of each top face, which is the M plane, of the underlying layer with respect to the surface of the substrate is preferably in a range of 30 degrees±5 degrees (3). Depending on the crystal growth conditions of the underlying layer, the shape of the cross section of the underlying layer taken along the <1-100> direction of the seed region may have four faces including two side faces extending upward substantially perpendicular to the surface of the substrate and two top faces extending from the upper ends of the side faces and meeting each other, or may have six faces including two side faces extending upward substantially perpendicular to the surface of the substrate, two top faces extending from the upper ends of the side faces and meeting each other, and two bottom faces (each being the M plane) extending from the lower ends of the side faces to the seed region. The end face of the underlying layer in the <0001> direction of the seed region may be a perpendicular plane.

Herein, the inclination angle $\theta_M$ is defined as an angle between the top face and the surface of the substrate on the assumption that the underlying layer is cut along a phantom plane that is at right angles to the intersection line between a phantom extension of the top face of the underlying layer, which is the M plane, and the surface of the substrate and that is perpendicular to the surface of the substrate.

In the GaN semiconductor light-emitting element or the method for manufacturing the same according to any or the first to the third embodiments of the present invention, the substrate may be a sapphire substrate of which surface is the R plane, i.e., the {1-102} plane, or the substrate may be a GaN substrate of which surface is the A plane. Examples of the method for obtaining the A plane of a GaN substrate include a method of polishing a GaN substrate using a chemical mechanical polishing (CMP) method and a method of cutting a GaN substrate with a dicer. Note that the R plane of the sapphire substrate and the A plane of the GaN substrate each include a plane with an off-angle of plus/minus 5 degrees. In some cases, a buffer layer, for example, composed of a GaN-based compound semiconductor (more specifically, for example, GaN) may be disposed between the substrate and the base layer (of which top face is the A plane).

In general, the following directions (orientations):
<hk$\bar{i}$l> direction
<h$\bar{k}$il> direction are designated for convenience as the <hk-il> direction and <h-kil> direction in this specification or claims. Furthermore, for example, the following crystal plane:

{11$\bar{2}$0} plane is designated for convenience as the {11-20} plane, and in a hexagonal system, for example, the following crystal planes:
{hk$\bar{i}$l} plane
{h$\bar{k}$il} plane are designated for convenience as the {hk-il} plane and {h-kil} plane in this specification. Note that the A plane, the S plane, the M plane, and the C plane are as follows, which are schematically shown in FIGS. 15A to 15C.
A plane: {11-20}
S plane: {1-101}
M plane: {1-100}
C plane: {0001}

In the GaN semiconductor light-emitting element or the method for manufacturing the same according to the first or the second embodiment, since planes that are substantially equivalent to the S plane and the C plane are included, the expressions (1-1), (1-2), (2-1), and (2-2) are employed. That is, planes with an off-angle of plus/minus 5 degrees are included. In the GaN semiconductor light-emitting element or the method for manufacturing the same according to the third embodiment, since planes that are substantially equivalent to the M plane are included, the expression (3) is employed. That is, planes with an off-angle of plus/minus 5 degrees are included.

In the GaN semiconductor light-emitting element or the method for manufacturing the same according to the first or the second embodiment, preferably, the second electrode is mainly disposed on the second GaN-based compound semiconductor layer disposed above the side face or the inclined face, which is the S plane, of the underlying layer. In the GaN semiconductor light-emitting element or the method for manufacturing the same according to the third embodiment of the present invention, preferably, the second electrode is disposed on the second GaN-based compound semiconductor layer disposed above the top face, which is the M plane, of the underlying layer.

In the GaN semiconductor light-emitting element or the method for manufacturing the same according to any one of the first to third embodiments including the preferred embodiments (hereinafter, may be simply referred to as the embodiments), in some cases, the underlying layer may be designed so as to serve as the first GaN-based compound semiconductor layer of the first conductivity type. The base layer is preferably of the first conductivity type. Note that the GaN-based compound semiconductor and the GaN-based compound semiconductor layer may be collectively designated as the GaN-based compound semiconductor (layer) depending on the case.

According to the embodiments of the present invention, as the GaN-based compound semiconductor (layer), GaN (layer), AlGaN (layer), InGaN (layer), AlInGaN (layer), or GaN-based compound semiconductor (layer) obtained by incorporating boron (B) atoms or thallium (Tl) atoms into any of these compound semiconductors (layers) may be used. Examples of the method for forming the GaN-based compound semiconductor (layer) include MOCVD, molecular beam epitaxy (MBE), and hydride vapor deposition in which a halogen contributes to transportation or reaction.

As the organogallium source gas, trimethylgallium (TMG) gas or triethylgallium (TEG) gas may be used, and as the nitrogen source gas, ammonia gas or hydrazine gas may be used. Furthermore, examples of the combination of the first conductivity type and the second conductivity type include a combination of n type and p type and a combination of p type and n type. In the formation of an n-type GaN-based compound semiconductor (layer), for example, silicon (Si) may be added as an n-type impurity. In the formation of a p-type GaN-based compound semiconductor (layer), for example, magnesium (Mg) may be added as a p-type impurity. Furthermore, when the GaN-based compound semiconductor (layer) includes aluminum (Al) or indium (In) as a constituent atom, trimethylaluminum (TMA) gas may be used as an Al source and trimethylindium (TMI) gas may be used as an In source. Furthermore, monosilane gas ($SiH_4$ gas) may be used as an Si source, and cyclopentadienylmagnesium gas may be used as an Mg source. Furthermore, in addition to Si, examples of the n-type impurity include Ge, Se, Sn, C, and Ti. In addition to Mg, examples of the p-type impurity include Zn, Cd, Be, Ca, Ba, and O.

The active layer composed of a GaN-based compound semiconductor may be a single GaN-based compound semiconductor layer (e.g., $In_xGa_{(1-x)}N$ layer) or may have a single quantum well (QW) structure or a multiple quantum well (MQW) structure.

When the second conductivity type is p type, preferably, the second electrode has a single-layer structure or a multilayer structure including at least one metal selected from the group consisting of palladium (Pd), platinum (Pt), nickel (Ni), gold (Au), silver (Ag), aluminum (Al), and rhodium (Rh) (e.g., Ni/Ag structure, Ni/Ag/Au structure, or Ag/Au structure deposited in that order on the second GaN-based compound semiconductor layer). On the other hand, when the first conductivity type is n type, preferably, the first electrode has a single-layer structure or a multilayer structure including at least one metal selected from the group consisting of gold (Au), aluminum (Al), titanium (Ti), tungsten (W), copper (Cu), zinc (Zn), tin (Sn), and indium (In). Examples thereof include Ti/Au, Ti/Al, and Ti/Pt/Au. The first electrode and the second electrode may be formed by physical vapor deposition (PVD), such as vacuum deposition.

According to the embodiments, the crystal growth of a GaN-based compound semiconductor layer does not occur on the surface of the substrate, which is the R plane of the sapphire substrate, or the mask layer. The crystal growth of the underlying layer starts on the seed region (i.e., the A plane), and the underlying layer extends over the surface of the substrate, which is the R plane of the sapphire substrate, or over the mask layer.

Specific examples of the mask layer include high-melting-point metal layers, such as a silicon oxide layer ($SiO_x$ layer), a silicon nitride layer ($SiN_y$ layer), a $Ta_2O_5$ layer, a $ZrO_2$ layer, an AlN layer, an $Al_2O_3$ layer, and a laminate of two or more of these layers (e.g., a structure in which a silicon oxide layer and a silicon nitride layer are deposited from the bottom), an Ni layer, and a tungsten layer. The mask layer can be formed by chemical vapor deposition (CVD) or PVD, such as vacuum deposition or sputtering. As the method for forming the opening or the open region, etching or a lift-off method may be used.

As the method for forming a seed region on the surface of a substrate, which is the R plane of a sapphire substrate or the A plane of a GaN substrate, for example, a method can be used in which a base layer composed of a GaN-based compound semiconductor of which top face is the A plane is formed on the surface of a substrate, which is the R plane of a sapphire substrate or the A plane of a GaN substrate, a mask layer is formed on the top face of the base layer, and then an island-like or strip-like open region is formed in the mask layer, the open region exposing a portion of the top face of the base layer. Alternatively, a mask layer which exposes the A plane of a GaN substrate may be formed on the A plane of the GaN substrate. As the method for forming a seed region on the surface of a substrate, which is the R plane of a sapphire substrate, a method can be used in which a seed layer composed of a GaN-based compound semiconductor of which top face is the A plane is formed on the surface of a substrate, which is the R plane of a sapphire substrate, and then the seed layer is selectively etched such that a seed region composed of the seed layer remains on the substrate.

Examples of the GaN semiconductor light-emitting element according to the embodiments include light-emitting diodes (LEDs) and semiconductor lasers or laser diodes (LDs). As long as the laminate structure including GaN-based compound semiconductor layers is a light-emitting diode structure or a laser structure, the type and composition of the GaN-based compound semiconductor are not particularly limited, and the type and structure of the GaN-based compound semiconductor layer are also not particularly limited.

In the GaN semiconductor light-emitting element or the method for manufacturing the same according to the first embodiment, the top face of the seed layer is the A plane, and at least one side face of the underlying layer is the S plane. Consequently, the inclination angle of the side face is gentle, and the second electrode can be easily formed. Furthermore, in the GaN semiconductor light-emitting element or the method for manufacturing the same according to the second embodiment, the top face of the seed region is the A plane, the strip-like seed region extends in the <1-100> direction of the seed region, and one inclined face of the underlying layer is the S plane. Consequently, the inclination angle of the inclined face is gentle, and the second electrode can be easily formed. Furthermore, in the GaN semiconductor light-emitting element or the method for manufacturing the same according to the third embodiment, the top face of the seed region is the A plane, the strip-like seed region extends in the <0001> direction of the seed region, and at least one face of the underlying layer is the M plane. Consequently, the inclination angle of the top face is gentle, and the second electrode can be easily formed. Therefore, a highly reliable second electrode can be formed securely, and thus reliability of the GaN semiconductor light-emitting element can be improved.

Furthermore, since at least one side face of the underlying layer is the S plane or at least one inclined face of the underlying layer is the S plane, when an active layer, for example, composed of $In_xGa_{(1-x)}N$ is formed by crystal growth, crystallinity can be improved.

That is, for example, when an active layer composed of $In_xGa_{(1-x)}N$ is formed by crystal growth on a surface of the first GaN-based compound semiconductor layer, which is the C plane, the nitrogen atom that is likely to be removed is linked by one bond to the gallium atom. In contrast, when an active layer composed of $In_xGa_{(1-x)}N$ is formed by crystal growth on a surface of the first GaN-based compound semiconductor layer, which is the inclined S plane, the nitrogen atom is linked by two or more bonds to the gallium atom. Therefore, the V/III ratio effectively increases, and crystallinity can be improved. Furthermore, since crystal growth occurs in an orientation that is different from the crystal orientation of the seed region, the dislocation extending upward from the seed region may bend, thus being advantageous in reducing defects.

Additional features and advantages are described herein, and will be apparent from, the following Detailed Description and the figures.

BRIEF DESCRIPTION OF THE FIGURES

FIG. 6A is a partial schematic cross-sectional view of a GaN semiconductor light-emitting element in Example 4, FIG. 6B is a schematic top view of an underlying layer of the GaN semiconductor light-emitting element shown in FIG. 6A, and FIG. 6C is a schematic perspective view of the underlying layer;

FIG. 9 is a partial schematic cross-sectional view of a GaN semiconductor light-emitting element in Example 5;

FIGS. 12A and 12B are each a partial schematic cross-sectional view of the substrate, etc. for showing a step, subsequent to that shown in FIG. 11B, in the method for manufacturing the GaN semiconductor light-emitting element in Example 6;

DETAILED DESCRIPTION

Embodiments will be described based on examples with reference to the drawings.

EXAMPLE 1

Figure 1A:
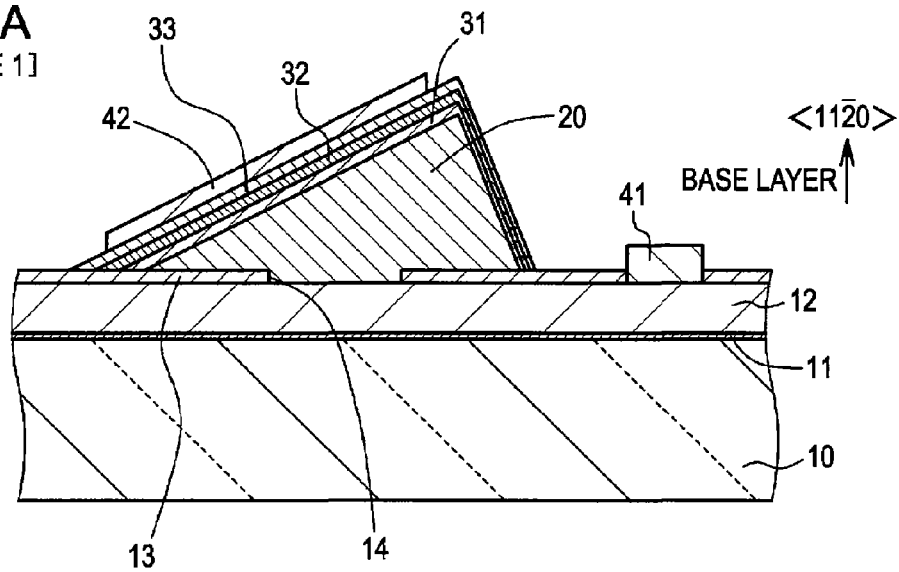
FIG. 1A is a partial schematic cross-sectional view of a GaN semiconductor light-emitting element in Example 1.
Figure 1B:
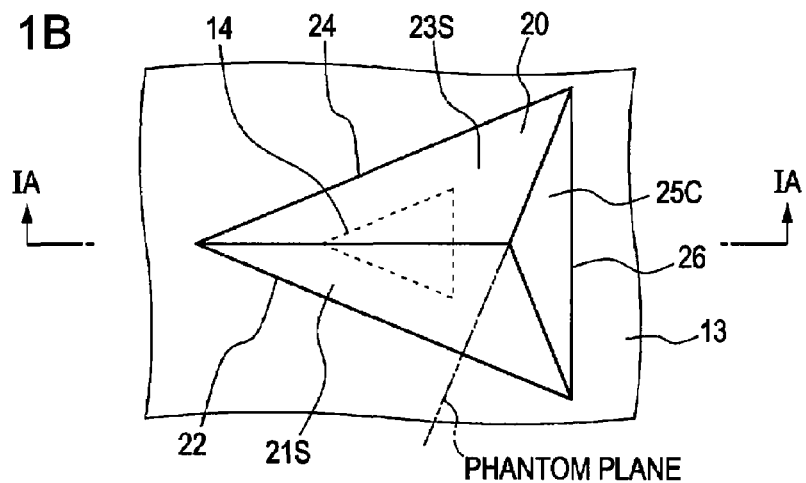
FIG. 1B is a schematic top view of an underlying layer of the GaN semiconductor light-emitting element shown in FIG. 1A.
Figure 1C:
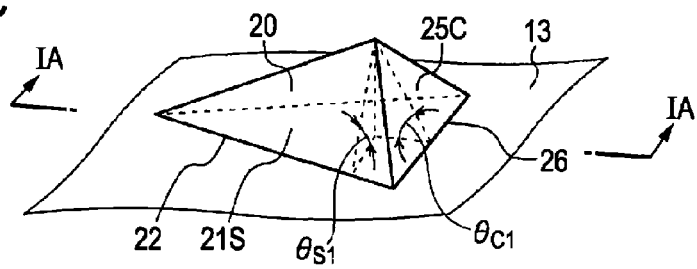
FIG. 1C is a schematic perspective view of the underlying layer.
Figure 2A:
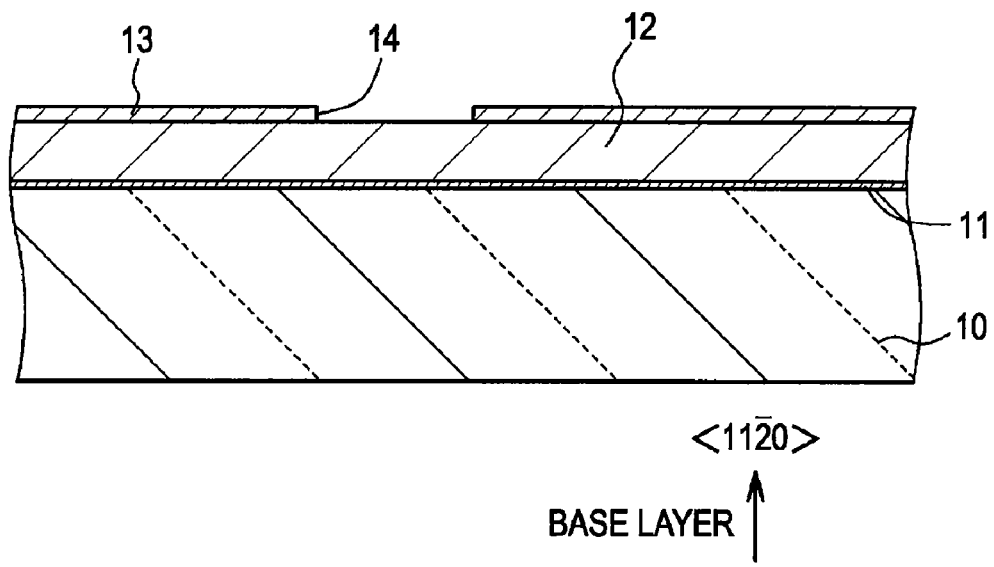
FIGS. 2A and 2B are each a partial schematic cross-sectional view of a substrate, etc. for showing a step in a method for manufacturing a GaN semiconductor light-emitting element in Example 1.
Figure 2B:
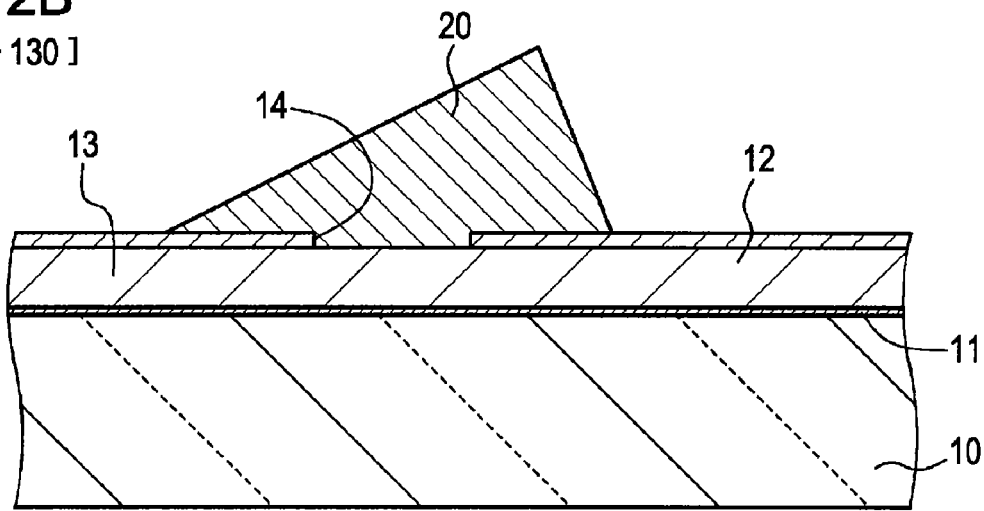

Example 1 relates to a GaN semiconductor light-emitting element and a method for manufacturing the same according to the first embodiment of the present invention, and more specifically to the structure 1A. FIG. 1A is a partial schematic cross-sectional view of a GaN semiconductor light-emitting element in Example 1, FIG. 1B is a top view of an underlying layer of the GaN semiconductor light-emitting element, and FIG. 1C is a schematic perspective view of the underlying layer. FIG. 1A is a partial schematic cross-sectional view taken along the line IA-IA of FIG. 1B or 1C.

The GaN semiconductor light-emitting element in Example 1 includes (A) an island-like seed region composed of a GaN-based compound semiconductor disposed on a substrate 10; (B) an underlying layer 20 having a three-dimensional shape composed of a GaN-based compound semiconductor, disposed on at least the seed region; (C) a first GaN-based compound semiconductor layer 31 of a first conductivity type, an active layer 32 composed of a GaN-based compound semiconductor, and a second GaN-based compound semiconductor layer 33 of a second conductivity type disposed in that order on the underlying layer 20; (D) a first electrode 41 electrically connected to the first GaN-based compound semiconductor layer 31; and (E) a second electrode 42 disposed on the second GaN-based compound semiconductor layer 33.

In Example 1 or in any of Examples 2 to 6 which will be described below, the first conductivity type is n type, and the second conductivity type is p type. The active layer 32 has a multiple quantum well structure including ten layers, each layer being composed of InGaN/GaN=2.5 nm/15 nm. When a base layer 12 is provided, the base layer 12 is composed of a GaN-based compound semiconductor (specifically, GaN) of the first conductivity type (n type). When a mask layer 13, 113, or 213 is provided, the mask layer 13, 113, or 213 has a laminate structure including a silicon oxide layer with a thickness of 200 nm and a silicon nitride layer with a thickness of 10 nm (the silicon oxide layer being a lower layer, the silicon nitride layer being an upper layer). In the drawings, the mask layer is shown as a single layer. The underlying layer 20, 120, or 220 is composed of a GaN-based compound semiconductor (specifically, GaN) of the first conductivity type (n type). Furthermore, the first electrode 41 composed of aluminum (Al) is electrically connected to the first GaN-based compound semiconductor layer 31. Unless otherwise described, the first electrode 41 is electrically connected to the first GaN-based compound semiconductor layer 31 through a hole provided in the mask layer 13, 113, or 213, the base layer 12, and the underlying layer 20, 120, or 220. The second electrode 42 has a laminate structure of Ni/Ag/Au.

In Example 1, the GaN semiconductor light-emitting element includes a base layer 12 composed of a GaN-based compound semiconductor (specifically, GaN) of the first conductivity type (n type) disposed on the surface of the substrate 10, which is the R plane of a sapphire substrate, and a mask layer 13 disposed on a top face of the base layer 12, the mask layer 13 having an opening 14 which exposes a portion of the top face of the base layer 12. The portion exposed in the opening 14 corresponds to the seed region, and the underlying layer 20 extends from over the top face of the base layer 12 exposed in the opening 14 to over the mask layer 13 in the vicinity of the opening 14. The second electrode 42 is disposed on the second GaN-based compound semiconductor layer 33, and more specifically, on the second GaN-based compound semiconductor layer 33 disposed above side faces 21S and 23S, each being the S plane (which will be described below).

The top face of the seed region (base layer 12) is the A plane. Furthermore, at least one side face of the underlying layer 20 is the S plane. The inclination angle $\theta_{S1}$ of each of the side faces 21S and 23S, which is the S plane, of the underlying layer 20 with respect to the surface of the substrate is in a range of 40.2 degrees±5 degrees (1-1).

In Example 1, the underlying layer 20 has a shape of a pyramid having an isosceles triangular bottom face. Two side faces 21S and 23S, each being the S plane, of the underlying layer 20 respectively have, as bases, two sides 22 and 24 of equal length of the bottom face, and the remaining one side face 25C has, as a base, the other side 26 of the bottom face and is the C plane (specifically, negative C plane). The inclination angle $\theta_{C1}$ of the side face 25C, which is the C plane, of the underlying layer 20 with respect to the surface of the substrate is in a range of 90 degrees±5 degrees (1-2). Furthermore, the planar shape of the opening 14 formed in the mask layer 13 is triangular. The sides 22 and 24 each have a length of 3.8 μm and the side 26 has a length of 5.5 μm.

A method for manufacturing a GaN semiconductor light-emitting element in Example 1 will be described below with reference to FIGS. 2A, 2B, 3A, and 3B which are each a partial schematic cross-sectional view of a substrate, etc.

First, an island-like seed region composed of a GaN-based compound semiconductor is formed on a substrate 10. Specifically, a base layer 12 composed of a GaN-based compound semiconductor, the top face of the base layer 12 being the A plane, is formed on the substrate 10. Subsequently, a mask layer 13 is formed on the base layer 12, the mask layer 13 having an island-like opening 14 which exposes a portion of the top face of the base layer 12.

[Step-100]

That is, a sapphire substrate whose principal surface is the R plane is used as the substrate 10. The substrate 10 is placed into an MOCVD system and subjected to cleaning at a substrate temperature of 1,050° C. for 10 minutes in a carrier gas composed of hydrogen. Then, the substrate temperature is decreased to 500° C. The R plane of the sapphire substrate corresponds to the {1-102} plane. A buffer layer 11 composed of low-temperature GaN with a thickness of 30 nm is formed by crystal growth on the substrate 10 by means of MOCVD in which trimethylgallium (TMG) gas as a gallium source is supplied while ammonia gas as a nitrogen source is being supplied, and then the supply of TMG gas is halted.

[Step-110]

After the substrate temperature is increased to 1,020° C., the supply of TMG gas and monosilane (SiH$_4$) gas as a silicon source is started. Thus, a base layer 12 composed of GaN doped with Si (GaN:Si) with n-type conductivity with a thickness of 3 μm is formed by crystal growth on the buffer layer 11. The doping concentration is about $5\times10^{18}$/cm$^3$. The top face of the base layer 12 is the A plane.

[Step-120]

Subsequently, a mask layer 13 is formed on the top face of the base layer 12, the mask layer 13 having an opening 14 which exposes a portion of the top face of the base layer 12. Specifically, the substrate 10 is taken out of the MOCVD system, and the mask layer 13 having the opening 14 is formed on the base layer 12 (refer to FIG. 2A which is a partial schematic cross-sectional view). The mask layer 13 having the opening 14 has a laminate structure including a silicon oxide layer with a thickness of 200 nm and a silicon nitride layer with a thickness of 10 nm disposed on the silicon oxide layer, and can be formed by means of plasma CVD, lithography, and wet etching using a hydrofluoric acid-based etchant or dry etching. The planar shape of the opening 14 is triangular. The pitch (distance between the centers of two adjacent openings 14) is 40 μm. The sides of the opening 14 having an isosceles triangular planar shape are, respectively, 5.5 μm, 3.5 μm, and 3.5 μm in length.

[Step-130]

Next, an underlying layer 20 composed of a GaN-based compound semiconductor having a three-dimensional shape is formed on at least the seed region.

That is, specifically, the underlying layer 20 composed of a GaN-based compound semiconductor of the first conductivity type (n type) is formed by crystal growth so as to extend over the top face of the base layer 12 exposed in the opening 14 and over the mask layer 13 in the vicinity of the opening 14. More specifically, the substrate 10 is placed into the MOCVD system again. After the substrate temperature is increased to 1,020° C., the supply of TMG gas and monosilane gas is started. Thus, the underlying layer 20 composed of GaN doped with Si (GaN:Si) with n-type conductivity is formed by crystal growth on the base layer 12 exposed in the opening 14. The doping concentration is about $5\times10^{18}$/cm$^3$. In this step, the crystal growth of the underlying layer 20 starts on the base layer 12 exposed in the opening 14, and the growing underlying layer 20 extends over the mask layer 13. That is, the underlying layer 20 is selectively grown. Thereby, the structure shown in the partial schematic cross-sectional view of FIG. 2B, in the top view of FIG. 1B, and in the schematic perspective view of FIG. 1C can be obtained. Since the crystal growth of the underlying layer 20 also occurs in a lateral direction with respect to the opening 14, the densities of dislocations propagated from the base layer 12 and stacking faults can be significantly reduced. Table 1 below shows the crystal growth conditions in MOCVD for the underlying layer 20.

TABLE 1

| | |
|---|---|
| V/III ratio | About 4,000 |
| Feed rate of organogallium source gas | $70 \times 10^{-6}$ mol · cm$^{-2}$ · min$^{-1}$ |
| Feed rate of nitrogen source gas | 6 SLM |
| Net growth rate | 4 μm/hr |
| Pressure of nitrogen source gas | $9 \times 10^4$ Pa |

[Step-140]

Figure 3A:
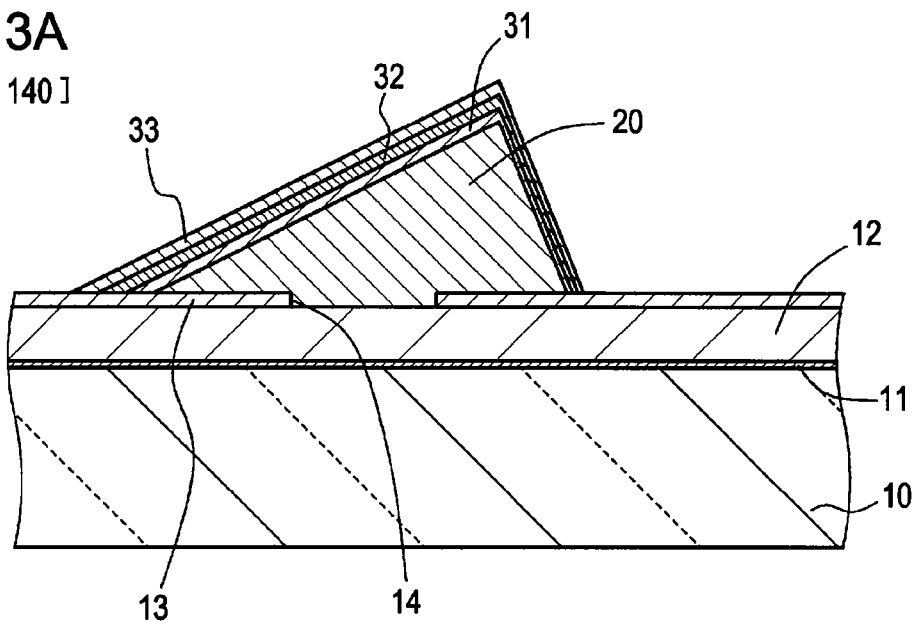
FIGS. 3A and 3B are each a partial schematic cross-sectional view of the substrate, etc. for showing a step, subsequent to that shown in FIG. 2B, in the method for manufacturing the GaN semiconductor light-emitting element in Example 1.
Figure 3B:
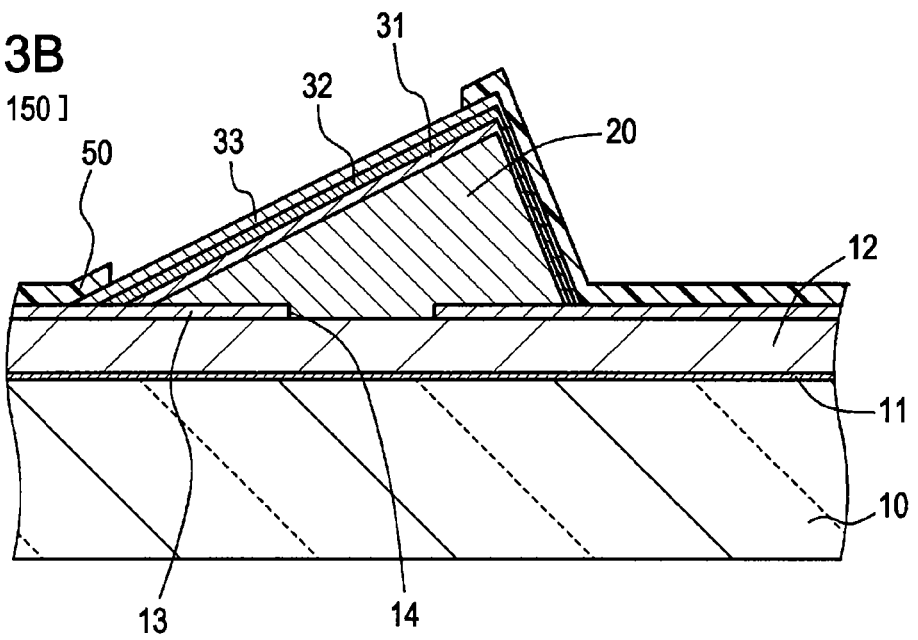

Subsequently, a first GaN-based compound semiconductor layer 31 of the first conductivity type (n type), an active layer 32 composed of a GaN-based compound semiconductor having a multiple quantum well structure, and a second GaN-based compound semiconductor layer 33 of the second conductivity type (p type) are formed by crystal growth in that order on the underlying layer 20. Specifically, at a substrate temperature of 1,020° C., the first GaN-based compound semiconductor layer 31 composed of GaN:Si is formed, and then the supply of TMG gas and SiH$_4$ gas is halted. The carrier gas is switched from hydrogen gas to nitrogen gas, and the substrate temperature is decreased to 600° C. to 800° C. Triethylgallium (TEG) gas is used as a Ga source and trimethylindium (TMI) gas is used as an In source. By switching the valve, these gases are supplied. First, an undoped GaN layer (not shown) is formed by crystal growth. Subsequently, the active layer 32 having a multiple quantum well structure including well layers composed INGaN with a thickness of 2.5 nm and barrier layers composed of GaN with a thickness of 15 nm is formed. The compositional proportion of In in the well layer is, for example, 0.23, which corresponds to a luminescence wavelength λ of 515 nm. The compositional proportion of In in the well layer can be determined according to the desired luminescence wavelength. After the formation of the multiple quantum well structure is completed, the carrier gas is switched from nitrogen to hydrogen, and the substrate temperature is increased to 850° C. By starting the supply of TMG gas and biscyclopentadienyl magnesium (Cp$_2$Mg) gas, the second GaN-based compound semiconductor layer 33 composed of GaN doped with Mg (GaN:Mg) with p-type conductivity with a thickness of 100 nm is formed by crystal growth on the active layer 32. The doping concentration is about $1 \times 10^{20}$/cm$^3$. Subsequently, a contact layer composed of InGaN doped with Mg with a thickness of several nanometers may be formed on the second GaN-based compound semiconductor layer 33. After crystal growth is completed as described above, annealing treatment is carried out in a nitrogen gas atmosphere at 800° C. for 10 minutes to activate the p-type impurity (p-type dopant). Thereby, the structure shown in FIG. 3A is obtained.

[Step-150]

Next, a first electrode 41 electrically connected to the first GaN-based compound semiconductor layer 31 is formed, and a second electrode 42 is formed on the second GaN-based compound semiconductor layer 33. Specifically, a resist layer 50 is formed over the entire surface, and a portion of the resist layer 50 corresponding to a second electrode-forming region is removed by photolithography (refer to FIG. 3B). Subsequently, a lift-off method is performed in which an Ni layer, an Ag layer, and an Au layer are formed by sputtering in that order over the entire surface, and then the resist layer 50 and the Ni layer, the Ag layer, and the Au layer disposed thereon are removed. Thus, the second electrode 42 (in the drawing shown as a single layer) having a laminate structure is formed on the second GaN-based compound semiconductor layer 33, more specifically, on the second GaN-based compound semiconductor layer 33 disposed above the side faces 21S and 23S, each being the S plane, of the underlying layer 20. Subsequently, a part of the mask layer 13 is removed by photolithography and etching to expose the base layer 12, and the first electrode 41 is formed on the exposed base layer 12 by photolithography, sputtering, and a lift-off method.

In Example 1, since the inclination angle $\theta_{S1}$ of each of the side faces 21S and 23S, each being the S plane, of the underlying layer 20 with respect to the surface of the substrate is in a range of 40.2 degrees±5 degrees (1-1), the inclination angle of the portion of the second GaN-based compound semiconductor layer 33 disposed above each of the side faces 21S and 23S, each being the S plane, of the underlying layer 20 is also in substantially the same range. It is certainly possible to form the second electrode 42 with high reliability on the second GaN-based compound semiconductor layer 33 having such a gentle inclination.

Subsequently, chips are formed by dicing, followed by resin molding and packaging. Thus, various types of light-emitting diodes (LEDs), such as shell-shaped LEDs and surface-mounting LEDs, can be fabricated.

Herein, the substrate temperature $T_{MAX}$ after the growth of the active layer 32 satisfies the relationship $T_{MAX} < 1,350-0.75\lambda$ (° C.), preferably, $T_{MAX} < 1,250-0.75\lambda$ (° C.), provided that the luminescence wavelength is $\lambda$ nm. By employing the above-mentioned substrate temperature $T_{MAX}$ after the growth of the active layer 32, as is also described in Japanese Unexamined Patent Application Publication No. 2002-319702, thermal degradation of the active layer 32 can be suppressed.

Furthermore, the surface of the substrate may be the A plane of a GaN substrate. In such a case, the formation of the buffer layer 11 may not be necessary. This also applied to Examples 2, 4, and 6 which will be described below. In such a case, a mask layer exposing the A plane of the GaN substrate is formed on the A plane of the GaN substrate. Alternatively, a base layer composed of a GaN-based compound semiconductor of which top face is the A plane is formed on the surface of the substrate, which is the A plane of the GaN substrate, a mask layer is formed on the top face of the base layer, and then an island-like or strip-like open region which exposes a portion of the top face of the base layer may be formed.

EXAMPLE 2

Figure 4A:
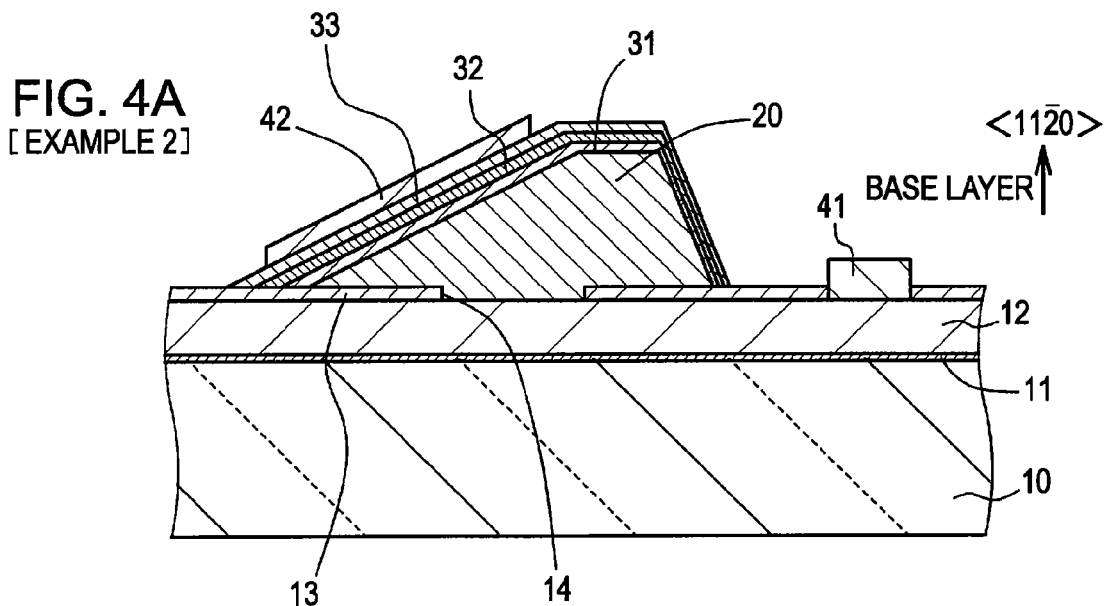
FIG. 4A is a partial schematic cross-sectional view of a GaN semiconductor light-emitting element in Example 2.
Figure 4B:
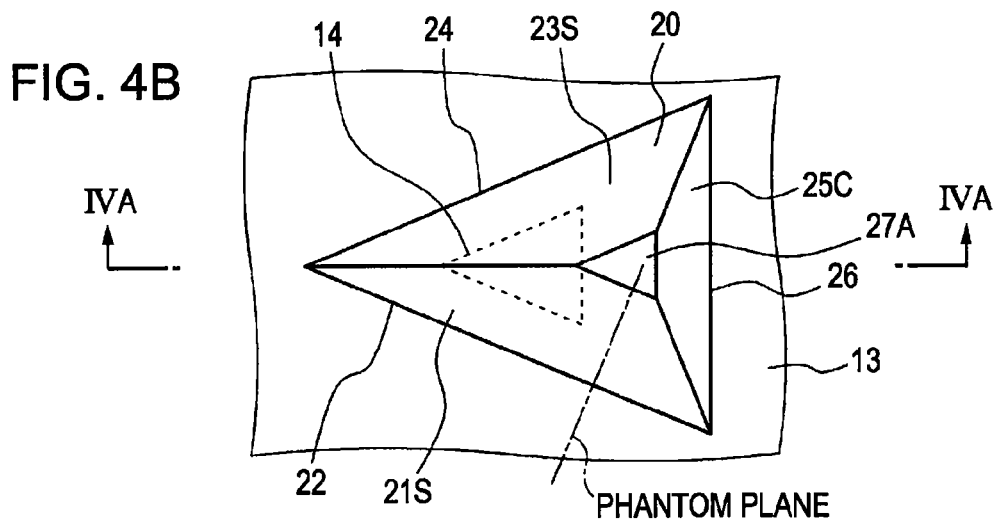
FIG. 4B is a schematic top view of an underlying layer of the GaN semiconductor light-emitting element shown in FIG. 4A.
Figure 4C:
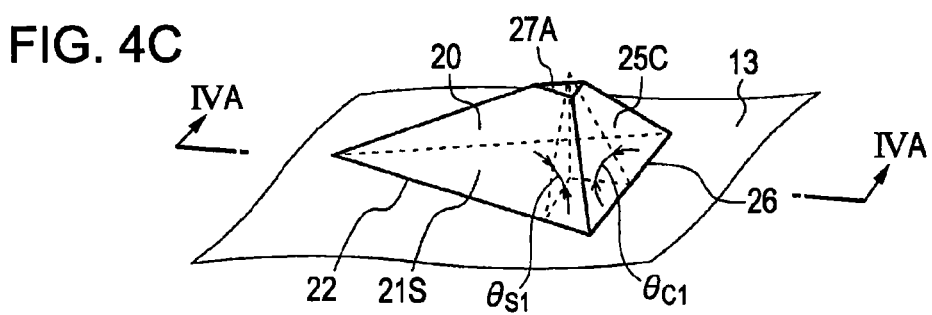
FIG. 4C is a schematic perspective view of the underlying layer.

Example 2 is a variation example of Example 1. In Example 2, the three-dimensional shape of the underlying layer 20 is different from that of the underlying layer 20 in Example 1. FIG. 4A is a partial schematic cross-sectional view of a GaN semiconductor light-emitting element in Example 2, FIG. 4B is a top view of an underlying layer of the GaN semiconductor light-emitting element shown in FIG. 4A, and FIG. 4C is a schematic perspective view of the underlying layer. FIG. 4A is a partial schematic cross-sectional view taken along the line IVA-IVA of FIG. 4B or 4C.

Specifically, in Example 2, the underlying layer 20 has a shape of a truncated pyramid having an isosceles triangular bottom face. Two side faces 21S and 23S, each being the S plane, of the underlying layer 20 respectively have, as bases, two sides 22 and 24 of equal length of the bottom face, and the remaining one side face 25C has, as a base, the other side 26 of the bottom face and is the C plane (specifically, negative C plane). A top face 27A of the underlying layer 20 is the A plane. The inclination angle $\theta_{C1}$ of the side face 25C, which is the C plane, of the underlying layer 20 with respect to the surface of the substrate is in a range of 90 degrees±5 degrees (1-2).

The GaN semiconductor light-emitting element in Example 2 can be manufactured following the same steps as those described in the method for manufacturing the GaN semiconductor light-emitting element in Example 1. However, the crystal growth conditions in MOCVD for the underlying layer 20 are set as shown in Table 2 below instead of the crystal growth conditions in Step-130 of Example 1. These crystal growth conditions differ from those in Step-130 of Example 1 shown in Table 1 in that the growth temperature is slightly higher, the V/III ratio is lower, and the growth pressure is lower. Thereby, the underlying layer 20 having a three-dimensional shape of a truncated pyramid is obtained.

TABLE 2

| | |
|---|---|
| V/III ratio | About 500 |
| Feed rate of organogallium source gas | $70 \times 10^{-6}$ mol · cm$^{-2}$ · min$^{-1}$ |
| Feed rate of nitrogen source gas | 2 SLM |
| Net growth rate | 4 μm/hr |
| Pressure of nitrogen source gas | $1 \times 10^4$ Pa |

EXAMPLE 3

Figure 5:
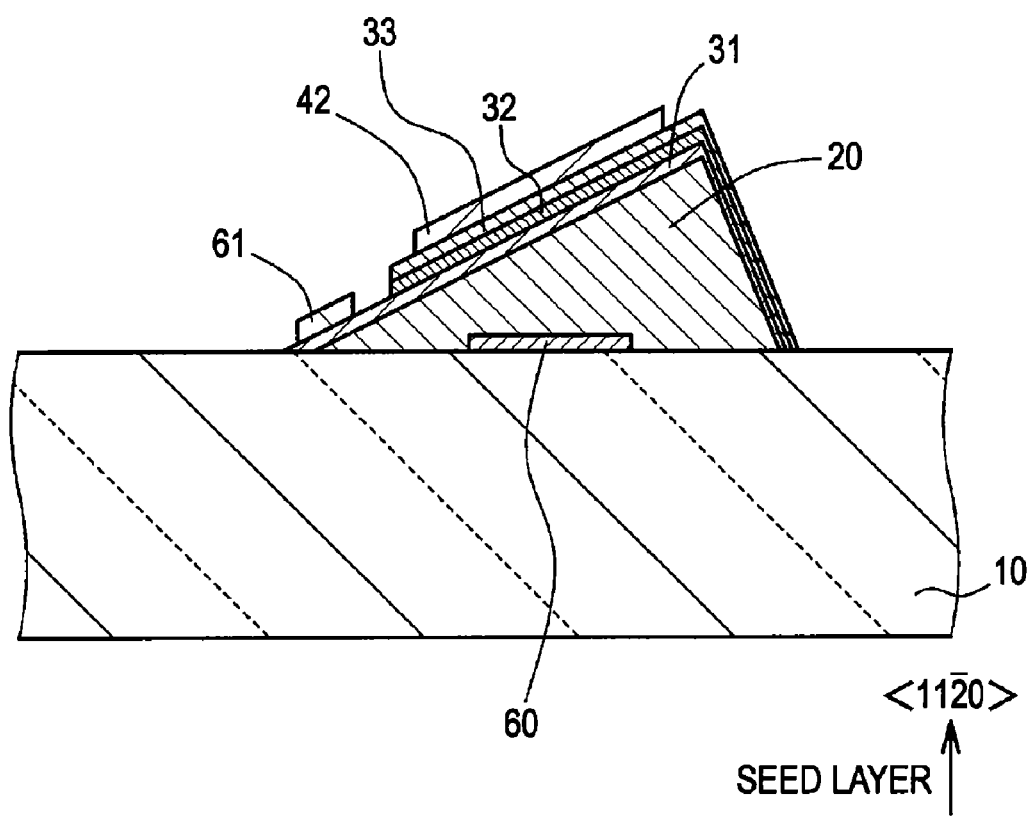
FIG. 5 is a partial schematic cross-sectional view of a GaN semiconductor light-emitting element in Example 3.
Figure 7A:
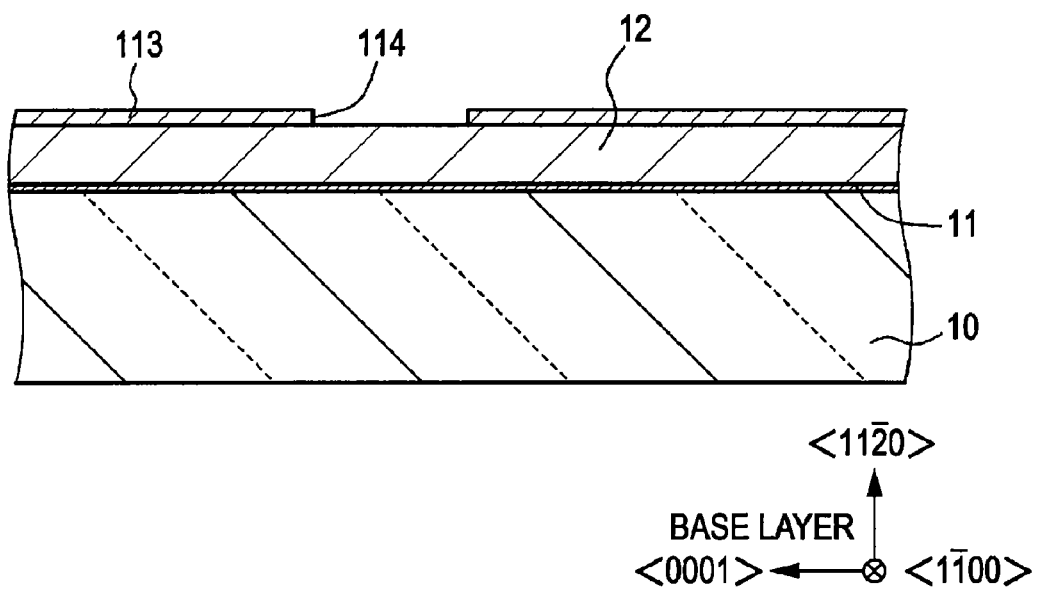
FIGS. 7A and 7B are each a partial schematic cross-sectional view of a substrate, etc. for showing a step in a method for manufacturing a GaN semiconductor light-emitting element in Example 4.
Figure 7B:
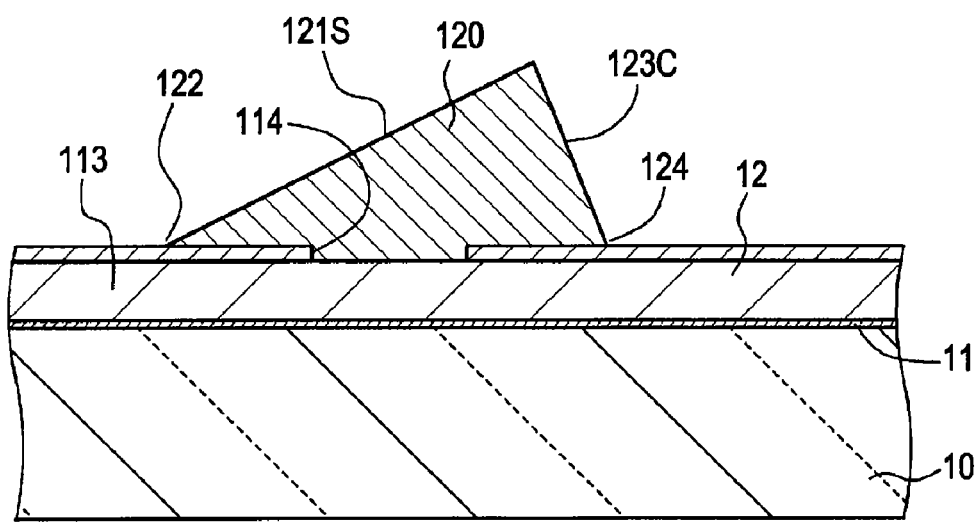

Example 3 is also a variation example of Example 1 and relates to the structure 1B. As shown in a partial schematic cross-sectional view of FIG. 5, Example 3 differs from Example 1 in that a seed region composed of a seed layer 60 composed of a GaN-based compound semiconductor (specifically, GaN), the top face of which is the A plane, is formed like an island on the surface of a substrate 10, which is the R plane of a sapphire substrate, and the underlying layer 20 extends from over the seed layer 60 to over the substrate 10.

The planar shape of the island-like seed layer 60 is triangular. This triangle has the same size as that of the opening 14 in Example 1. Except for the above-mentioned differences, the GaN semiconductor light-emitting element of Example 3 has the same feature and structure as those of the GaN semiconductor light-emitting element described in Example 1, and thus detailed description thereof is omitted. Note that a first electrode 61 is directly connected to the first GaN-based compound semiconductor layer 31.

In the GaN semiconductor light-emitting element of Example 3, a sapphire substrate whose principal surface is the R plane is used as the substrate 10. The substrate 10 is placed into an MOCVD system and subjected to cleaning at a substrate temperature of 1,050° C. for 10 minutes in a carrier gas composed of hydrogen. By carrying out the same step as Step-110 in Example 1, a seed layer similar to the base layer 12 is formed, and an etching mask is formed on the seed layer. A region of the seed layer in which a seed layer 60 is to be formed is covered with the etching mask. Next, the region of the seed layer not covered with the etching mask is removed by etching to expose the substrate 10, which is the R plane of the sapphire substrate. Then, the etching mask is removed. Thereby, the island-like seed layer 60 formed on the surface of the substrate 10, which is the R plane of the sapphire substrate, can be obtained. Subsequently, by carrying out Step-130 and thereafter of Example 1, the GaN semiconductor light-emitting element of Example 3 can be obtained.

The feature and structure of the GaN semiconductor light-emitting element of Example 3 can be applied to the GaN semiconductor light-emitting element described in Example 2.

EXAMPLE 4

Example 4 relates to a GaN semiconductor light-emitting element and a method for manufacturing the same according to the second embodiment of the present invention, and more specifically to the structure 2A. FIG. 6A is a partial schematic cross-sectional view of a GaN semiconductor light-emitting element in Example 4, FIG. 6B is a top view of an underlying layer of the GaN semiconductor light-emitting element, and FIG. 6C is a schematic perspective view of the underlying layer. FIG. 6A is a partial schematic cross-sectional view taken along the line VIA-VIA of FIG. 6B or 6C.

The GaN semiconductor light-emitting element in Example 4 includes (A) a strip-like seed region composed of a GaN-based compound semiconductor disposed on a substrate 10; (B) an underlying layer 120 having a three-dimensional shape composed of a GaN-based compound semiconductor, disposed on at least the seed region; (C) a first GaN-based compound semiconductor layer 31 of a first conductivity type, an active layer 32 composed of a GaN-based compound semiconductor, and a second GaN-based compound semiconductor layer 33 of a second conductivity type disposed in that order on the underlying layer 120; (D) a first electrode 41 electrically connected to the first GaN-based compound semiconductor layer 31; and (E) a second electrode 42 disposed on the second GaN-based compound semiconductor layer 33.

In Example 4, the GaN semiconductor light-emitting element includes a base layer 12 composed of a GaN-based compound semiconductor (specifically, GaN) disposed the surface of the substrate 10, which is the R plane of a sapphire substrate, and a mask layer 113 disposed on a top face of the base layer 12, the mask layer 113 having a strip-like open region 114 which exposes a portion of the top face of the base layer 12. The portion of the top face of the base layer 12 exposed in the strip-like open region 114 corresponds to the seed region, and the underlying layer 120 extends from over the top face of the base layer 12 exposed in the open region 114 to over the mask layer 113 in the vicinity of the open region 114. The second electrode 42 is disposed on the second GaN-based compound semiconductor layer 33, and more specifically, in Example 4, on the second GaN-based compound semiconductor layer 33 disposed above an inclined face 121S which is the S plane (which will be described below).

The top face of the seed region (base layer 12) is the A plane. The strip-like seed region (i.e., the portion of the base layer 12 exposed in the open region 114 provided in the mask layer 113) extends in the <1-100> direction of the seed region (base layer 12). As a result, in the underlying layer 120 formed by crystal growth on the strip-like seed region, one inclined face 121S is the S plane. The shape of a cross-section of the underlying layer 120 taken along the <0001> direction of the seed region (base layer) is triangular, and the inclination angle $\theta_{S2}$ of the inclined face 121S, which is the S plane, of the underlying layer 120 with respect to the surface of the substrate is in a range of 40.2 degrees±5 degrees (2-1). Furthermore, the other inclined face 123C of the underlying layer 120 is the C plane (more specifically, negative C plane). The inclination angle $\theta_{C2}$ of the other inclined face 123C, which is the C plane, of the underlying layer 120 with respect to the surface of the substrate is in a range of 90 degrees±5 degrees (2-2). The width (W) of the open region 114 in the <0001> direction of the base layer 12 is 10 μm. The length of one inclined face 121S in the <0001> direction of the base layer is 20 μm, and the length of the other inclined face 123C in the <0001> direction of the base layer 12 is 10 μm. Reference numerals 122 and 124 represent a base of the inclined face 121S and a base of the inclined face 123C, respectively.

A method for manufacturing a GaN semiconductor light-emitting element in Example 4 will be described below with reference to FIGS. 7A, 7B, 8A, and 8B which are each a partial schematic cross-sectional view of a substrate, etc.

First, a strip-like seed region composed of a GaN-based compound semiconductor is formed on a substrate 10. Specifically, a base layer 12 composed of a GaN-based compound semiconductor, the top face of the base layer 12 being the A plane, is formed on the substrate 10. Subsequently, a mask layer 113 is formed on the base layer 12, the mask layer 113 having a strip-like open region 114 which exposes a portion of the top face of the base layer 12.

[Step-400]

That is, as in Step-100 of Example 1, a sapphire substrate whose principal surface is the R plane is used as the substrate 10. The substrate 10 is placed into an MOCVD system and subjected to cleaning at a substrate temperature of 1,050° C. for 10 minutes in a carrier gas composed of hydrogen. Then, a buffer layer 11 composed of low-temperature GaN with a thickness of 30 nm is formed by crystal growth on the substrate 10.

[Step-410]

Next, as in Step-110 of Example 1, a base layer 12 composed of GaN doped with Si (GaN:Si) with n-type conductivity with a thickness of 3 μm is formed by crystal growth on the buffer layer 11.

[Step-420]

Subsequently, a mask layer 113 is formed on the top face of the base layer 12, the mask layer 113 having a strip-like open region 114 which exposes a portion of the top face of the base layer 12. Specifically, the substrate 10 is taken out of the MOCVD system, and the mask layer 113 having the open region 114 is formed on the base layer 12 (refer to FIG. 7A which is a partial schematic cross-sectional view). The mask layer 113 having the open region 114 has the same composition and structure as those of the mask layer 13 in Example 1, and the mask layer 113 can be formed in substantially the same manner as in Step-120 of Example 1. The pitch (distance between the centers of two adjacent open regions 114) is 30 μm. The open region 114 extends in the <1-100> direction of the seed region (base layer 12). That is, the strip-like seed region extends in the <1-100> direction of the seed region.

[Step-430]

Next, an underlying layer 120 composed of a GaN-based compound semiconductor having a three-dimensional shape is formed on at least the seed region.

That is, specifically, the underlying layer 120 composed of a GaN-based compound semiconductor of the first conductivity type (n type) is formed by crystal growth so as to extend over the top face of the base layer 12 exposed in the open region 114 and over the mask layer 113 in the vicinity of the open region 114. More specifically, the substrate 10 is placed into the MOCVD system again. After the substrate temperature is increased to 1,020° C., the supply of TMG gas and monosilane gas is started. Thus, the underlying layer 120 composed of GaN doped with Si (GaN:Si) with n-type conductivity is formed by crystal growth on the base layer 12 exposed in the open region 114. The doping concentration is about $5 \times 10^{18}/cm^3$. In this step, the crystal growth of the underlying layer 120 starts on the base layer 12 exposed in the open region 114, and the growing underlying layer 120 extends over the mask layer 113. That is, the underlying layer 120 is selectively grown. Thereby, the structure shown in the partial schematic cross-sectional view of FIG. 7B, in the top view of FIG. 6B, and in the schematic perspective view of FIG. 6C can be obtained. Since the crystal growth of the underlying layer 120 also occurs in a lateral direction with respect to the open region 114 (in the <0001> direction of the base layer 12), the densities of dislocations propagated from the base layer 12 and stacking faults can be significantly reduced. Table 3 below shows the crystal growth conditions in MOCVD for the underlying layer 120.

TABLE 3

| | |
|---|---|
| V/III ratio | About 4,000 |
| Feed rate of organogallium source gas | $70 \times 10^{-6}\ mol \cdot cm^{-2} \cdot min^{-1}$ |
| Feed rate of nitrogen source gas | 6 SLM |
| Net growth rate | 4 μm/hr |
| Pressure of nitrogen source gas | $9 \times 10^4$ Pa |

[Step-440]

Figure 8A:
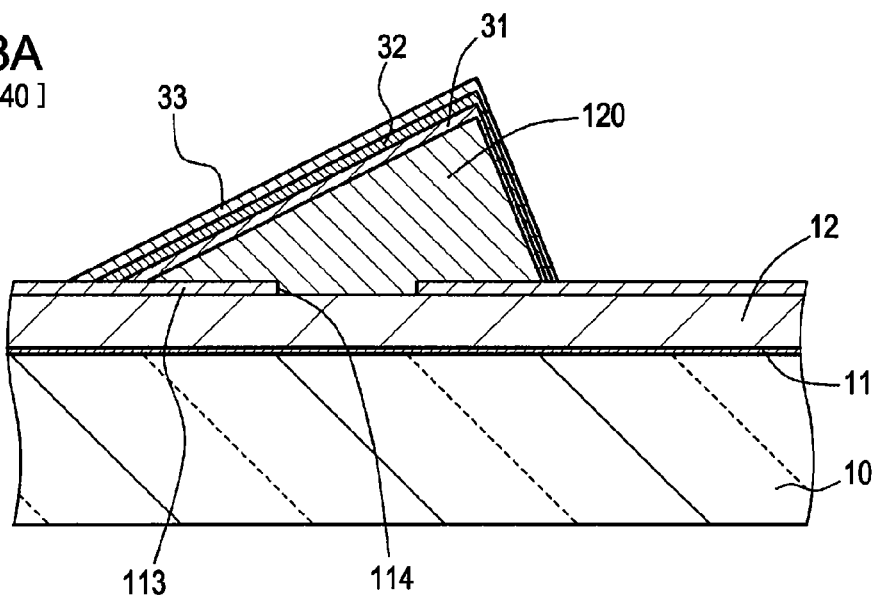
FIGS. 8A and 8B are each a partial schematic cross-sectional view of the substrate, etc. for showing a step, subsequent to that shown in FIG. 7B, in the method for manufacturing the GaN semiconductor light-emitting element in Example 4.
Figure 8B:
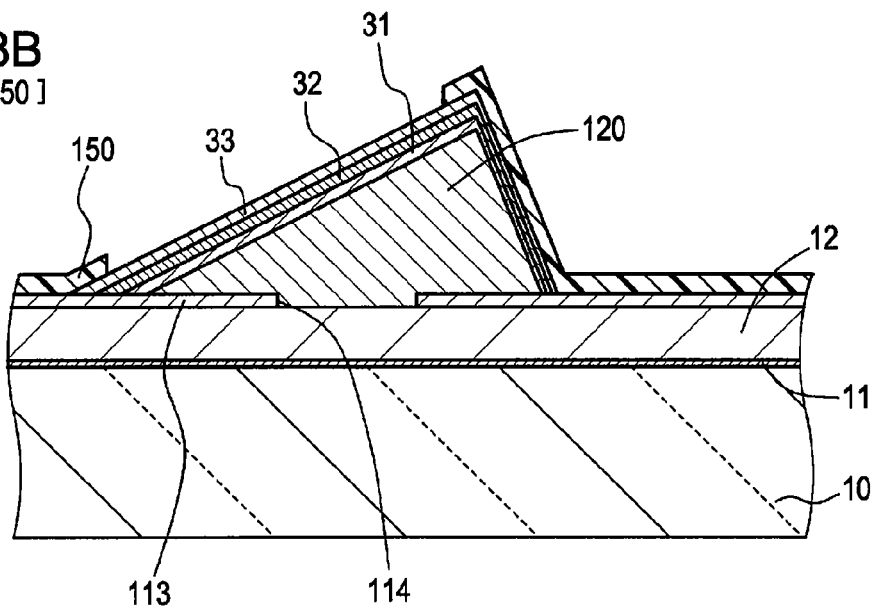

Subsequently, as in Step-140 of Example 1, a first GaN-based compound semiconductor layer 31 of the first conductivity type (n type), an active layer 32 composed of a GaN-based compound semiconductor having a multiple quantum well structure, and a second GaN-based compound semiconductor layer 33 of the second conductivity type (p type) are formed by crystal growth in that order on the underlying layer 120. Thereby, the structure shown in FIG. 8A is obtained.

[Step-450]

Next, a first electrode 41 electrically connected to the first GaN-based compound semiconductor layer 31 is formed, and a second electrode 42 is formed on the second GaN-based compound semiconductor layer 33. Specifically, a resist layer 150 is formed over the entire surface, and a portion of the resist layer 150 corresponding to a second electrode-forming region is removed by photolithography (refer to FIG. 8B). Subsequently, a lift-off method is performed in which an Ni layer, an Ag layer, and an Au layer are formed by sputtering in that order over the entire surface, and then the resist layer 150 and the Ni layer, the Ag layer, and the Au layer disposed thereon are removed. Thus, the second electrode 42 (in the drawing shown as a single layer) having a laminate structure is formed on the second GaN-based compound semiconductor layer 33, more specifically, on the second GaN-based compound semiconductor layer 33 disposed above the inclined face 121S, which is the S plane, of the underlying layer 120. Subsequently, a part of the mask layer 113 is removed by photolithography and etching to expose the base layer 12, and the first electrode 41 is formed on the exposed base layer 12 by photolithography, sputtering, and a lift-off method.

In Example 4, since the inclination angle $\theta_{S2}$ of the inclined face 121S, which is the S plane, of the underlying layer 120 with respect to the surface of the substrate is in a range of 40.2 degrees±5 degrees (2-1), the inclination angle of the portion of the second GaN-based compound semiconductor layer 33 disposed above inclined face 121S, which is the S plane, of the underlying layer 120 is also in substantially the same range. It is certainly possible to form the second electrode 42 with high reliability on the second GaN-based compound semiconductor layer 33 having such a gentle inclination.

Subsequently, chips are formed by dicing, followed by resin molding and packaging. Thus, various types of light-emitting diodes (LEDs), such as shell-shaped LEDs and surface-mounting LEDs, can be fabricated.

EXAMPLE 5

Example 5 is a variation example of Example 4 and relates to the structure 2B. As shown in a partial schematic cross-sectional view of FIG. 9, Example 5 differs from Example 4 in that a seed region composed of a seed layer 160 composed of a GaN-based compound semiconductor (specifically, GaN), the top face of which is the A plane, is formed like a strip on the surface of a substrate 10, which is the R plane of a sapphire substrate, and the underlying layer 120 extends from over the seed layer 160 to over the substrate 10. Except for the above-mentioned differences, the GaN semiconductor light-emitting element of Example 5 has the same feature and structure as those of the GaN semiconductor light-emitting element described in Example 4, and thus detailed description thereof is omitted. Note that a first electrode 61 is directly connected to the first GaN-based compound semiconductor layer 31. The seed layer 160 extends in the <1-100> direction.

In the GaN semiconductor light-emitting element of Example 5, a sapphire substrate whose principal surface is the R plane is used as the substrate 10. The substrate 10 is placed into an MOCVD system and subjected to cleaning at a substrate temperature of 1,050° C. for 10 minutes in a carrier gas composed of hydrogen. By carrying out the same step as Step-110 of Example 1, a seed layer similar to the base layer 12 is formed, and an etching mask is formed on the seed layer. A region of the seed layer in which a seed layer 160 is to be formed is covered with the etching mask. Next, the region of the seed layer not covered with the etching mask is removed by etching to expose the substrate 10, which is the R plane of the sapphire substrate. Then, the etching mask is removed. Thereby, the strip-like seed layer 160 extending in the <1-100> direction over the surface of the substrate 10, which is the R plane of the sapphire substrate, can be obtained.

Subsequently, by carrying out Step-430 and thereafter of Example 4, the GaN semiconductor light-emitting element of Example 5 can be obtained.

EXAMPLE 6

Figure 10A:
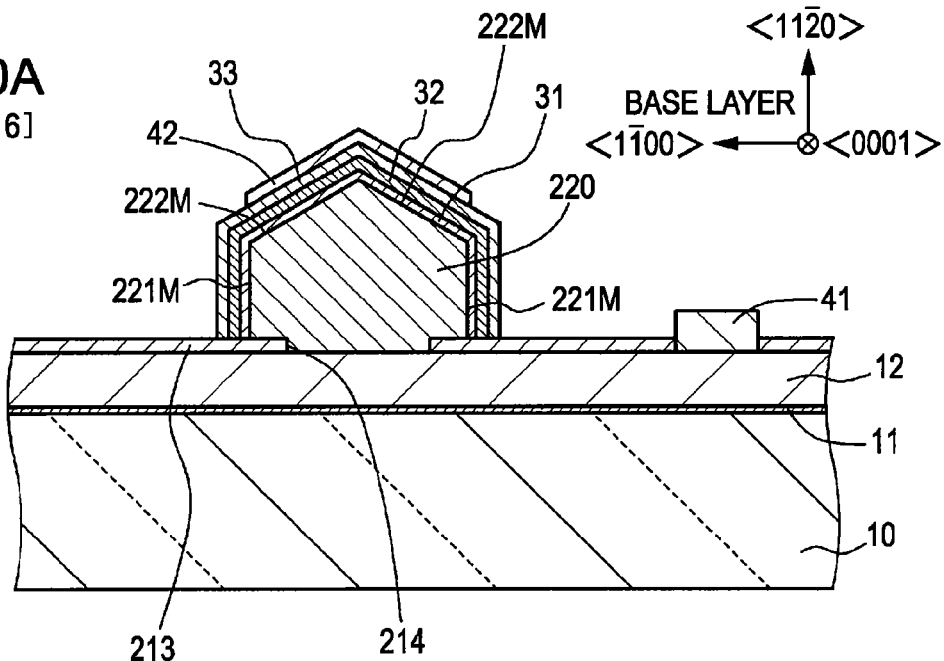
FIG. 10A is a partial schematic cross-sectional view of a GaN semiconductor light-emitting element in Example 6.
Figure 10B:
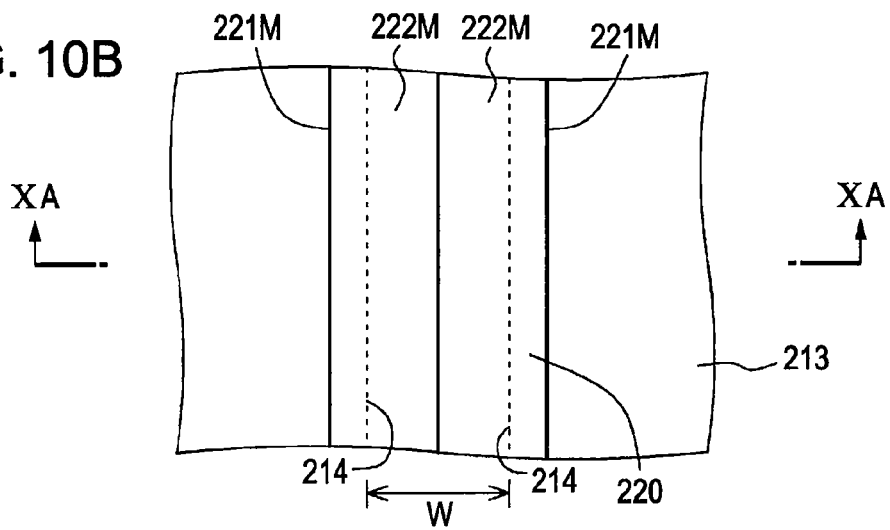
FIG. 10B is a schematic top view of an underlying layer of the GaN semiconductor light-emitting element shown in FIG. 10A.
Figure 10C:
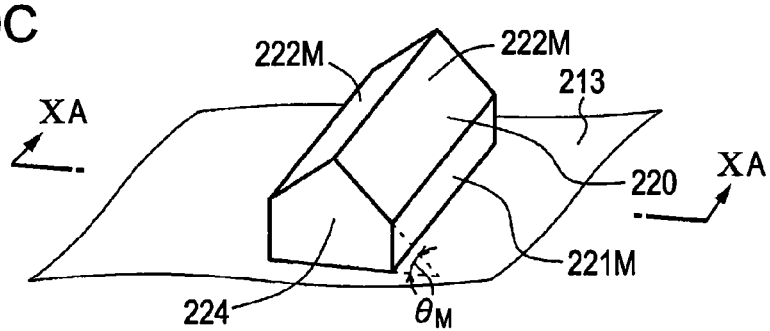
FIG. 10C is a schematic perspective view of the underlying layer.
Figure 11A:
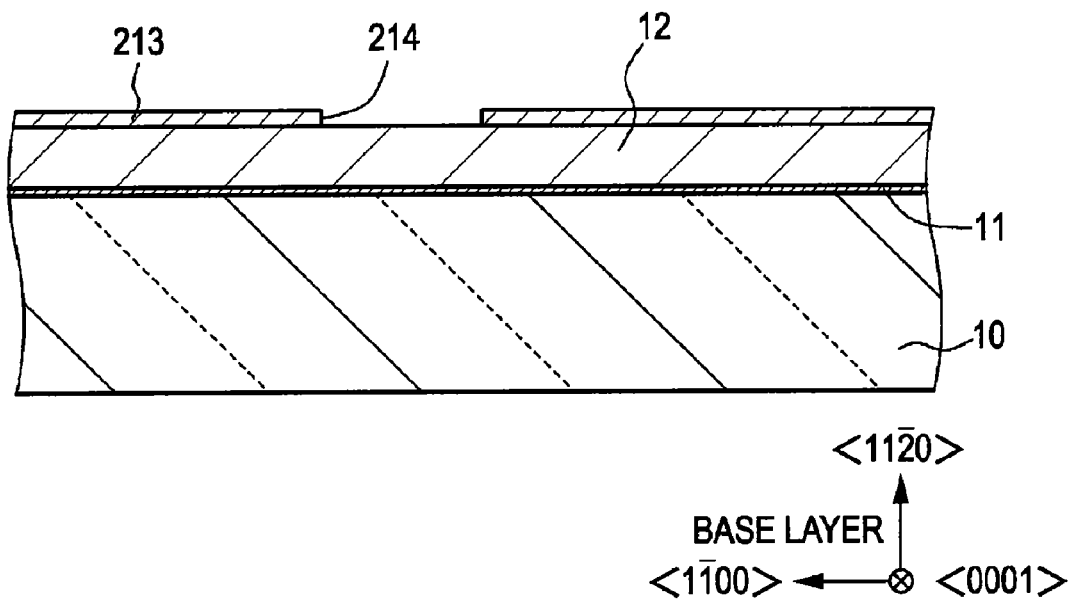
FIGS. 11A and 11B are each a partial schematic cross-sectional view of a substrate, etc. for showing a step in a method for manufacturing a GaN semiconductor light-emitting element in Example 6.
Figure 11B:
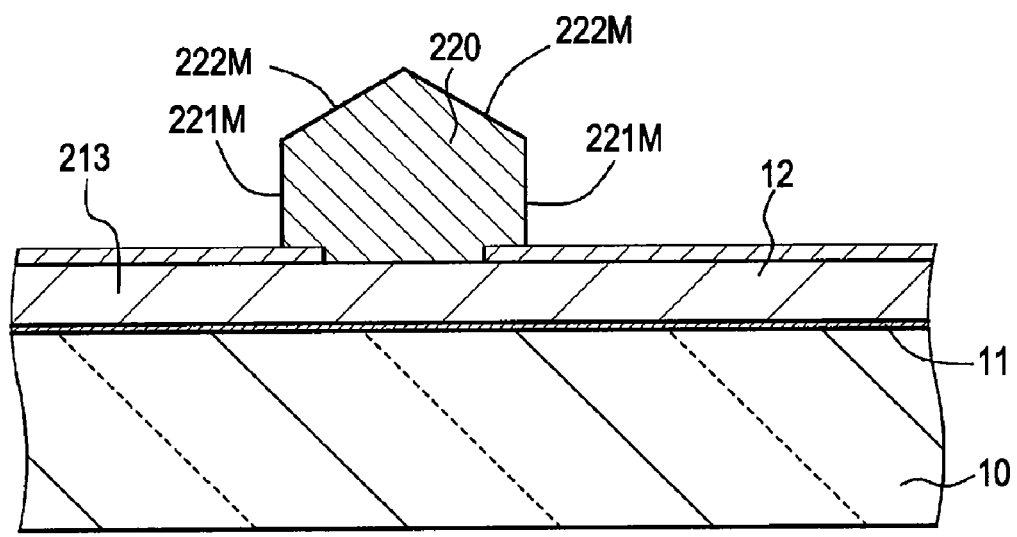

Example 6 relates to a GaN semiconductor light-emitting element and a method for manufacturing the same according to the third embodiment of the present invention. FIG. 10A is a partial schematic cross-sectional view of a GaN semiconductor light-emitting element in Example 6, FIG. 10B is a top view of an underlying layer of the GaN semiconductor light-emitting element, and FIG. 10C is a schematic perspective view of the underlying layer. FIG. 10A is a partial schematic cross-sectional view taken along the line XA-XA of FIG. 10B or 10C.

The GaN semiconductor light-emitting element in Example 6 includes (A) a strip-like seed region composed of a GaN-based compound semiconductor disposed on a substrate 10; (B) an underlying layer 220 having a three-dimensional shape composed of a GaN-based compound semiconductor, disposed on at least the seed region; (C) a first GaN-based compound semiconductor layer 31 of a first conductivity type, an active layer 32 composed of a GaN-based compound semiconductor, and a second GaN-based compound semiconductor layer 33 of a second conductivity type disposed in that order on the underlying layer 220; (D) a first electrode 41 electrically connected to the first GaN-based compound semiconductor layer 31; and (E) a second electrode 42 disposed on the second GaN-based compound semiconductor layer 33.

In Example 6, the GaN semiconductor light-emitting element includes a base layer 12 composed of a GaN-based compound semiconductor (specifically, GaN) disposed the surface of the substrate 10, which is the R plane of a sapphire substrate, and a mask layer 213 disposed on a top face of the base layer 12, the mask layer 113 having a strip-like open region 214 which exposes a portion of the top face of the base layer 12. The portion of the top face of the base layer 12 exposed in the strip-like open region 214 corresponds to the seed region, and the underlying layer 220 extends over the top face of the base layer 12 exposed in the open region 214. The second electrode 42 is disposed on the second GaN-based compound semiconductor layer 33, and more specifically, in Example 6, on the second GaN-based compound semiconductor layer 33 disposed above top faces 222M, each being the M plane (which will be described below).

The top face of the seed region (base layer 12) is the A plane. The strip-like seed region (i.e., the portion of the base layer 12 exposed in the open region 214 provided in the mask layer 213) extends in the <0001> direction of the seed region (base layer 12). As a result, in the underlying layer 220 which is formed by crystal growth on the strip-like seed region, at least one face is the M plane. Specifically, in Example 6, the shape of a cross-section of the underlying layer 220 taken along the <1-100> direction of the seed region (base layer 12) has two side faces 221M extending upward substantially perpendicular to the surface of the substrate and two top faces 222M extending from the upper ends of the side faces 221M and meeting each other. The two side faces 221M and the two top faces 222M of the underlying layer 220 are each the M plane. The inclination angle of $\theta_M$ of each top face 222M, which is the M plane, of the underlying layer 220 with respect to the surface of the substrate is in a range of 30 degrees±5 degrees (3). The width (W) of the open region 214 in the <1-100> direction of the base layer 12 is 10 μm. An end face 224 of the underlying layer 220 in the <0001> direction of the seed region (base layer 12) is a perpendicular plane.

When the end face 224 of the underlying layer 220 in the <0001> direction of the seed region (base layer 12) is used as a light emission surface, it is possible to obtain a semiconductor laser or laser diode (LD) that emits light from the end face 224.

A method for manufacturing a GaN semiconductor light-emitting element in Example 6 will be described below with reference to FIGS. 11A, 11B, 12A, and 12B which are each a partial schematic cross-sectional view of a substrate, etc.

First, a strip-like seed region composed of a GaN-based compound semiconductor is formed on a substrate 10. Specifically, a base layer 12 composed of a GaN-based compound semiconductor, the top face of the base layer 12 being the A plane, is formed on the substrate 10. Subsequently, a mask layer 213 is formed on the base layer 12, the mask layer 213 having a strip-like open region 214 which exposes a portion of the top face of the base layer 12.

[Step-600]

That is, as in Step-100 of Example 1, a sapphire substrate whose principal surface is the R plane is used as the substrate 10. The substrate 10 is placed into an MOCVD system and subjected to cleaning at a substrate temperature of 1,050° C. for 10 minutes in a carrier gas composed of hydrogen. Then, a buffer layer 11 composed of low-temperature GaN with a thickness of 30 nm is formed by crystal growth on the substrate 10.

[Step-610]

Next, as in Step-110 of Example 1, a base layer 12 composed of GaN doped with Si (GaN:Si) with n-type conductivity with a thickness of 3 μm is formed by crystal growth on the buffer layer 11.

[Step-620]

Subsequently, a mask layer 213 is formed on the top face of the base layer 12, the mask layer 213 having a strip-like open region 214 which exposes a portion of the top face of the base layer 12. Specifically, the substrate 10 is taken out of the MOCVD system, and the mask layer 213 having the open region 214 is formed on the base layer 12 (refer to FIG. 11A which is a partial schematic cross-sectional view). The mask layer 213 having the open region 214 has the same composition and structure as those of the mask layer 13 in Example 1, and the mask layer 213 can be formed in substantially the same manner as in Step-120 of Example 1. The pitch (distance between the centers of two adjacent open regions 214) is 30 μm. The open region 214 extends in the <0001> direction of the seed region (base layer 12). That is, the strip-like seed region extends in the <0001> direction of the seed region.

[Step-630]

Next, an underlying layer 220 composed of a GaN-based compound semiconductor having a three-dimensional shape is formed on at least the seed region.

That is, specifically, the underlying layer 220 composed of a GaN-based compound semiconductor of the first conductivity type (n type) is formed by crystal growth so as to extend from over the top face of the base layer 12 exposed in the open region 214 to over the mask layer 213 in the vicinity of the open region 214. More specifically, the substrate 10 is placed into the MOCVD system again. After the substrate temperature is increased to 1,020° C., the supply of TMG gas and monosilane gas is started. Thus, the underlying layer 220 composed of GaN doped with Si (GaN:Si) with n-type conductivity is formed by crystal growth on the base layer 12 exposed in the open region 214. The doping concentration is about 5×10$^{18}$/cm$^3$. In this step, the crystal growth of the underlying layer 220 starts on the base layer 12 exposed in the open region 214, and the growing underlying layer 220 extends over the mask layer 213. That is, the underlying layer 220 is selectively grown. Thereby, the structure shown in the partial schematic cross-sectional view of FIG. 11B, in the top view of FIG. 10B, and in the schematic perspective view of FIG. 10C can be obtained. Since the crystal growth of the underlying layer 220 also occurs in a lateral direction with respect to the open region 214 (in the <1-100> direction of the base layer 12), the densities of dislocations propagated from the base layer 12 and stacking faults can be significantly reduced. Table 4 below shows the crystal growth conditions in MOCVD for the underlying layer 220.

TABLE 4

| V/III ratio | About 4,000 |
|---|---|
| Feed rate of organogallium source gas | $70 \times 10^{-6}$ mol · cm$^{-2}$ · min$^{-1}$ |
| Feed rate of nitrogen source gas | 6 SLM |
| Net growth rate | 4 μm/hr |
| Pressure of nitrogen source gas | $1 \times 10^4$ Pa |

[Step-640]

Subsequently, as in Step-140 of Example 1, a first GaN-based compound semiconductor layer 31 of the first conductivity type (n type), an active layer 32 composed of a GaN-based compound semiconductor having a multiple quantum well structure, and a second GaN-based compound semiconductor layer 33 of the second conductivity type (p type) are formed by crystal growth in that order on the underlying layer 220. Thereby, the structure shown in FIG. 12A is obtained.

[Step-650]

Next, a first electrode 41 electrically connected to the first GaN-based compound semiconductor layer 31 is formed, and a second electrode 42 is formed on the second GaN-based compound semiconductor layer 33. Specifically, a resist layer 250 is formed over the entire surface, and a portion of the resist layer 250 corresponding to a second electrode-forming region is removed by photolithography (refer to FIG. 12B). Subsequently, a lift-off method is performed in which an Ni layer, an Ag layer, and an Au layer are formed by sputtering in that order over the entire surface, and then the resist layer 250 and the Ni layer, the Ag layer, and the Au layer disposed thereon are removed. Thus, the second electrode 42 (in the drawing shown as a single layer) having a laminate structure is formed on the second GaN-based compound semiconductor layer 33, more specifically, on the second GaN-based compound semiconductor layer 33 disposed above the top faces 220, each being the M plane, of the underlying layer 220. Subsequently, a part of the mask layer 213 is removed by photolithography and etching to expose the base layer 12, and the first electrode 41 is formed on the exposed base layer 12 by photolithography, sputtering, and a lift-off method.

In Example 6, since the inclination angle of $\theta_M$ of each top face 222M, which is the M plane, of the underlying layer 220 with respect to the surface of the substrate is in a range of 30 degrees±5 degrees (3), the inclination angle of the portion of the second GaN-based compound semiconductor layer 33 disposed above each top face 222M, which is the M plane, of the underlying layer 220 is also in substantially the same range. It is certainly possible to form the second electrode 42 with high reliability on the second GaN-based compound semiconductor layer 33 having such a gentle inclination.

Subsequently, chips are formed by dicing, followed by resin molding and packaging. Thus, various types of light-emitting diodes (LEDs), such as shell-shaped LEDs and surface-mounting LEDs, can be fabricated.

Figure 13:
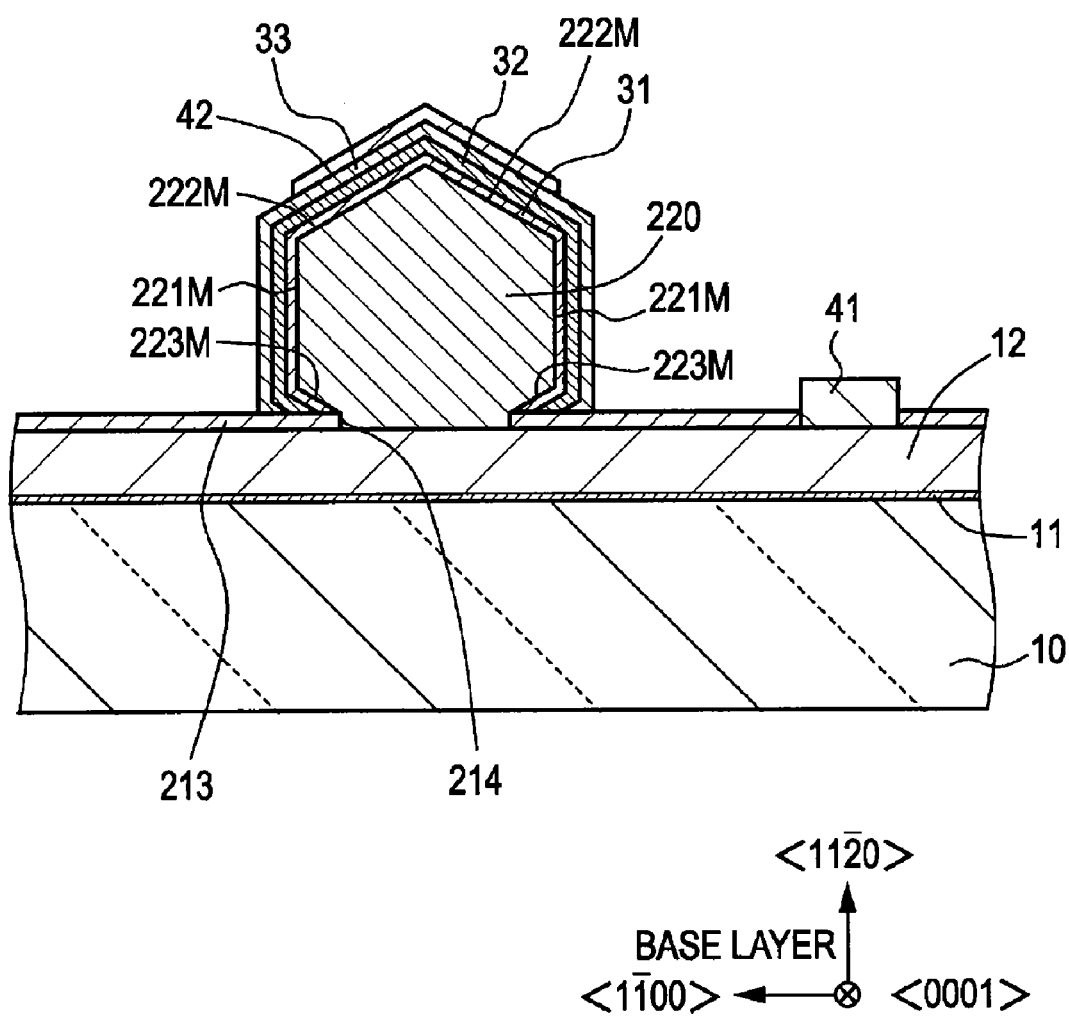
FIG. 13 is a partial schematic cross-sectional view of a variation example of the GaN semiconductor light-emitting element in Example 6.

Depending on the crystal growth conditions of the underlying layer 220, as shown in a partial schematic cross-sectional view of FIG. 13, the shape of the cross section of the underlying layer taken along the <1-100> direction of the seed region may have six faces including two side faces 221M extending upward substantially perpendicular to the surface of the substrate, two top faces 222M extending from the upper ends of the side faces 221M and meeting each other, and two bottom faces 223M (each being the M plane) extending from the lower ends of the side faces 221M to the seed region. The end face of the underlying layer in the <0001> direction of the seed region is a perpendicular plane. Table 5 below shows the crystal growth conditions in MOCVD for the underlying layer 220.

TABLE 5

| V/III ratio | About 4,000 |
|---|---|
| Feed rate of organogallium source gas | $70 \times 10^{-6}$ mol · cm$^{-2}$ · min$^{-1}$ |
| Feed rate of nitrogen source gas | 6 SLM |
| Net growth rate | 4 μm/hr |
| Pressure of nitrogen source gas | $1 \times 10^4$ Pa |

EXAMPLE 7

Figure 14:
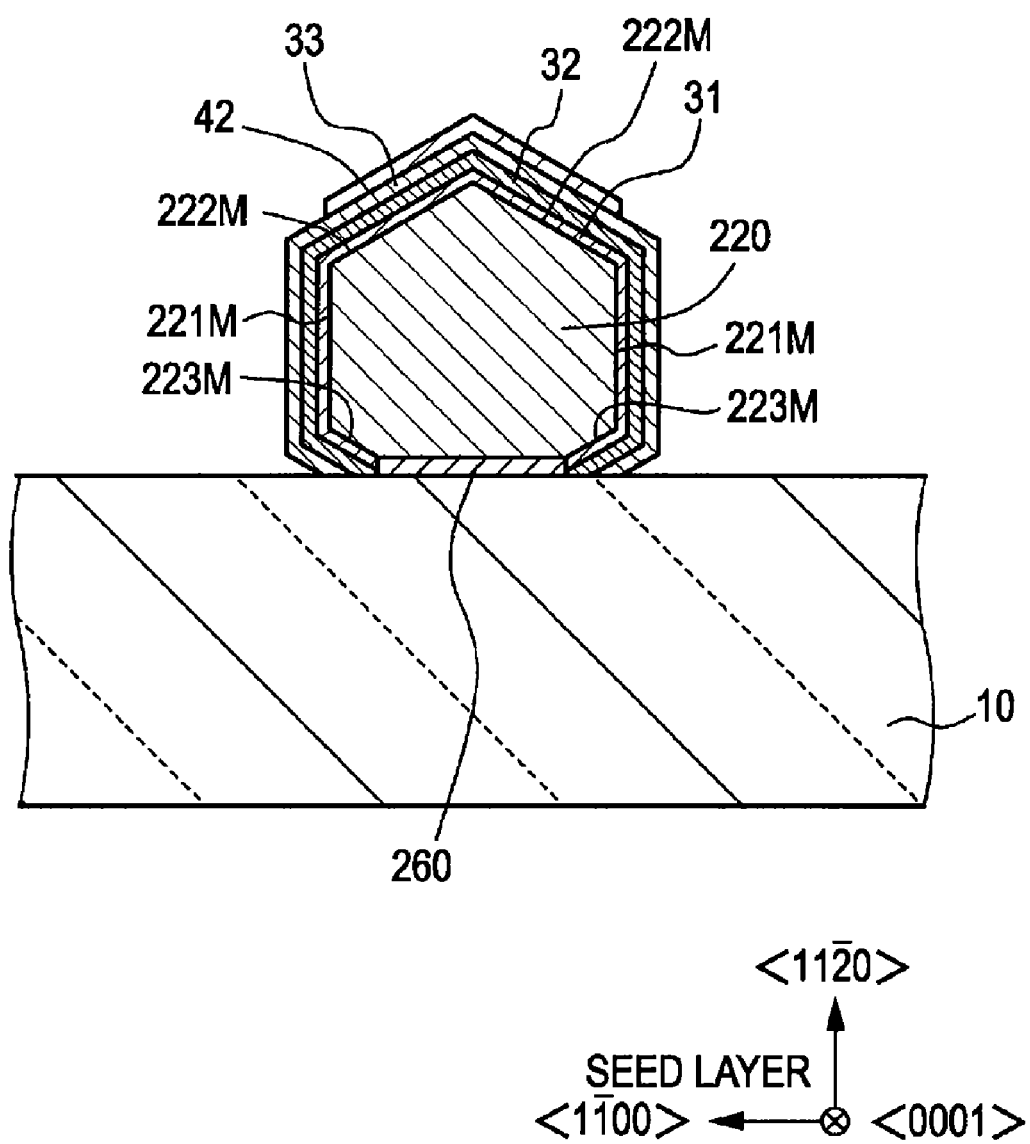
FIG. 14 is a partial schematic cross-sectional view of a GaN semiconductor light-emitting element in Example 7.
Figure 15A:
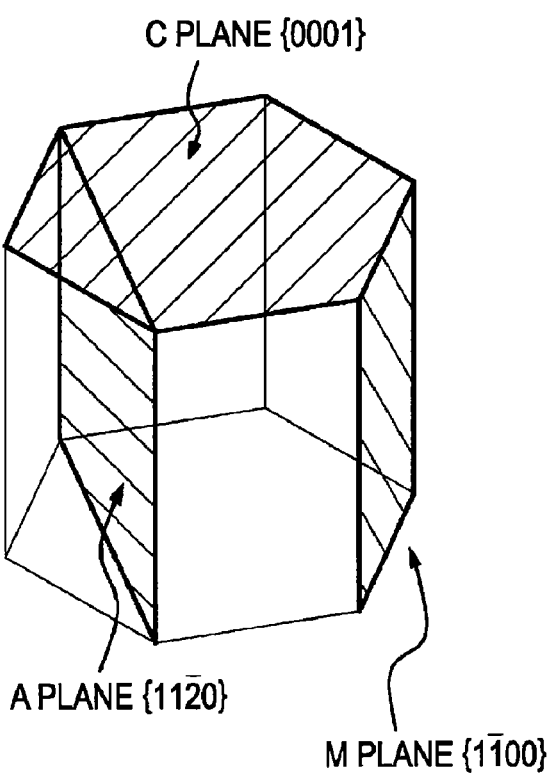
FIGS. 15A to 15C are schematic diagrams for describing the S plane, the A plane, the M plane, the C plane, and the R plane in the hexagonal crystal.
Figure 15B:
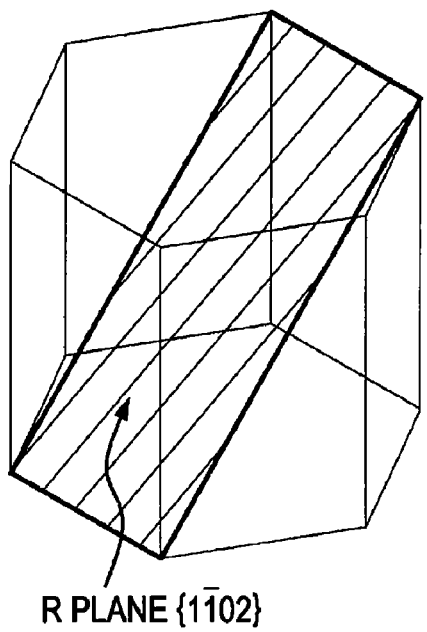
Figure 15C:
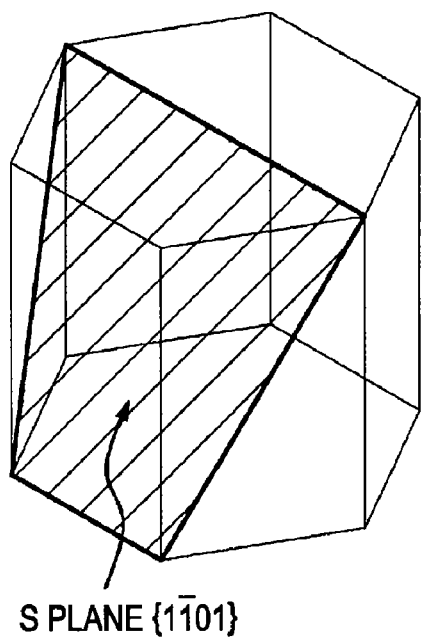

Example 7 is a variation example of Example 6. As shown in a partial schematic cross-sectional view of FIG. 14, Example 7 differs from Example 6 in that a seed region composed of a seed layer 260 composed of a GaN-based compound semiconductor (specifically, GaN), the top face of which is the A plane, is formed like a strip on the surface of a substrate 10, which is the R plane of a sapphire substrate, and the underlying layer 220 extends over the seed layer 260. Except for the above-mentioned differences, the GaN semiconductor light-emitting element of Example 7 has the same feature and structure as those of the GaN semiconductor light-emitting element described in Example 6, and thus detailed description thereof is omitted. A first electrode is not shown in the drawing. The seed layer 260 extends in the <1-100> direction.

In the GaN semiconductor light-emitting element of Example 7, a sapphire substrate whose principal surface is the R plane is used as the substrate 10. The substrate 10 is placed into an MOCVD system and subjected to cleaning at a substrate temperature of 1,050° C. for 10 minutes in a carrier gas composed of hydrogen. By carrying out the same step as Step-110 of Example 1, a seed layer similar to the base layer 12 is formed, and an etching mask is formed on the seed layer. A region of the seed layer in which a seed layer 260 is to be formed is covered with the etching mask. Next, the region of the seed layer not covered with the etching mask is removed by etching to expose the substrate 10, which is the R plane of the sapphire substrate. Then, the etching mask is removed. Thereby, the strip-like seed layer 260 extending in the <1-100> direction on the surface of the substrate 10, which is the R plane of the sapphire substrate, can be obtained. Subsequently, by carrying out Step-630 and thereafter of Example 6, the GaN semiconductor light-emitting element of Example 7 can be obtained.

The present invention has been described based on the examples according to the preferred embodiments. However, it is to be understood that the present invention is not limited to the examples. The types, compositions, thicknesses, structures, etc., of the substrate and the GaN-based compound semiconductor layers described in the examples are merely examples, and can be changed appropriately. Furthermore, the conditions, the numerical values, and the materials described in the examples are merely examples, and can be changed appropriately.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A GaN semiconductor light-emitting element comprising:
    an island-type seed region composed of a GaN-based compound semiconductor disposed on a substrate;
    an underlying layer having a three-dimensional shape composed of a GaN-based compound semiconductor, disposed on at least the seed region;
    a first GaN-based compound semiconductor layer of a first conductivity type, an active layer composed of a GaN-based compound semiconductor, and a second GaN-based compound semiconductor layer of a second conductivity type disposed in that order on the underlying layer;
    a first electrode electrically connected to the first GaN-based compound semiconductor layer; and
    a second electrode disposed on the second GaN-based compound semiconductor layer,
    wherein a top face of the seed region is the A plane, and at least one side face of the underlying layer is the S plane, and
    wherein the underlying layer has a shape of a pyramid having a bottom face, a shape of the bottom face being an isosceles triangle.

2. The GaN semiconductor light-emitting element according to claim 1, further comprising:
    a base layer composed of a GaN-based compound semiconductor disposed on the substrate; and
    a mask layer disposed on a top face of the base layer, the mask layer having an opening which exposes a portion of the top face of the base layer,
    wherein the portion of the top face of the base layer exposed in the opening corresponds to the seed region, and the underlying layer is disposed on the top face of the base layer exposed in the opening and extends over the mask layer in the vicinity of the opening.

3. The GaN semiconductor light-emitting element according to claim 2, wherein the planar shape of the opening provided in the mask layer is triangular.

4. The GaN semiconductor light-emitting element according to claim 1, wherein the underlying layer extends from over the seed region to over the substrate.

5. The GaN semiconductor light-emitting element according to claim 4, wherein the planar shape of the seed region is triangular.

6. The GaN semiconductor light-emitting element according to claim 1, wherein the inclination angle $\theta_{S1}$ of the side face, which is the S plane, of the underlying layer with respect to a surface of the substrate is in a range of 40.2 degrees±5 degrees (1-1).

7. The GaN semiconductor light-emitting element according to claim 6,
    wherein;
    two side faces, each being the S plane, of the underlying layer respectively have, as bases, the two sides of equal length of the bottom face, and the remaining one side face has, as a base, the other side of the bottom face and is the C plane; and
    the inclination angle $\theta_{C1}$ of the side face, which is the C plane, of the underlying layer with respect to the surface of the substrate is in a range of 90 degrees±5 degrees (1-2).

8. The GaN semiconductor light-emitting element according to claim 6,
    wherein the underlying layer has a shape of a truncated pyramid two side faces, each being the S plane, of the underlying layer respectively have, as bases, the two sides of equal length of the bottom face, the remaining one side face has, as a base, the other side of the bottom face and is the C plane, and a top face of the underlying layer is the A plane; and
    the inclination angle $\theta_{C1}$ of the side face, which is the C plane, of the underlying layer with respect to the surface of the substrate is in a range of 90 degrees±5 degrees (1-2).

9. The GaN semiconductor light-emitting element according to claim 1, wherein the substrate is a sapphire substrate of which surface is the R plane.

10. The GaN semiconductor light-emitting clement according to claim 1, wherein the substrate is a GaN substrate of which surface is the A plane.

* * * * *